(12) United States Patent
Inokuchi et al.

(10) Patent No.: US 7,977,719 B2
(45) Date of Patent: Jul. 12, 2011

(54) MAGNETO-RESISTANCE EFFECT ELEMENT AND MAGNETIC MEMORY

(75) Inventors: Tomoaki Inokuchi, Kawasaki (JP); Yoshiaki Saito, Kawasaki (JP); Hideyuki Sugiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/637,009

(22) Filed: Dec. 14, 2009

(65) Prior Publication Data

US 2010/0091556 A1 Apr. 15, 2010

Related U.S. Application Data

(62) Division of application No. 11/228,326, filed on Sep. 19, 2005, now Pat. No. 7,663,171.

(30) Foreign Application Priority Data

Mar. 22, 2005 (JP) ................................. 2005-082219

(51) Int. Cl.
  *H01L 29/76* (2006.01)
(52) U.S. Cl. ...................................... 257/295; 365/158
(58) Field of Classification Search .................... 257/295
  See application file for complete search history.

(56) References Cited

U.S. PATENT DOCUMENTS

| | | | |
|---|---|---|---|
| 6,714,444 B2 | 3/2004 | Huai et al. | |
| 6,987,653 B2 | 1/2006 | Inomata et al. | |
| 7,119,410 B2 | 10/2006 | Saito et al. | |
| 7,266,012 B2 * | 9/2007 | Saito et al. | 365/158 |
| 7,379,280 B2 * | 5/2008 | Fukumoto et al. | 360/324.2 |
| 7,663,171 B2 * | 2/2010 | Inokuchi et al. | 257/295 |
| 2001/0021124 A1 | 9/2001 | Odagawa et al. | |
| 2003/0016475 A1 | 1/2003 | Hoshiya et al. | |

(Continued)

FOREIGN PATENT DOCUMENTS

JP  2003-198004  7/2003

(Continued)

OTHER PUBLICATIONS

S. Haneda, et al., "Current Induced Magnetic Switching in Nanopillar with Two Pinned Layers.", 49th MMM Conference Digest HA-05, 2004, p. 394.

*Primary Examiner* — Thao P. Le
(74) *Attorney, Agent, or Firm* — Oblon, Spivak, McClelland, Maier & Neustadt, L.L.P.

(57) ABSTRACT

It is possible to reduce a current required for spin injection writing. A magneto-resistance effect element includes: a first magnetization pinned layer; a magnetization free layer; a tunnel barrier layer; a second magnetization pinned layer whose direction of magnetization is pinned to be substantially anti-parallel to the direction of magnetization of the first magnetization pinned layer, and; a non-magnetic layer. When the second magnetization pinned layer is made of ferromagnetic material including Co, material for the non-magnetic layer is metal including at least one element selected from the group consisting of Zr, Hf, Rh, Ag, and Au; when the second magnetization pinned layer is made of ferromagnetic material including Fe, material for the non-magnetic layer is metal including at least one element selected from the group consisting of Rh, Pt, Ir, Al, Ag, and Au; and when the second magnetization pinned layer is made of ferromagnetic material including Ni, material for the non-magnetic layer is metal including at least one element selected from the group consisting of Zr, Hf, Au, and Ag.

21 Claims, 30 Drawing Sheets

U.S. PATENT DOCUMENTS

| | | |
|---|---|---|
| 2004/0052006 A1 | 3/2004 | Odagawa et al. |
| 2004/0165425 A1 | 8/2004 | Nakamura et al. |
| 2005/0057960 A1* | 3/2005 | Saito et al. .................... 365/154 |
| 2005/0185347 A1 | 8/2005 | Inomata et al. |
| 2008/0239589 A1* | 10/2008 | Guo et al. ................ 360/324.12 |

FOREIGN PATENT DOCUMENTS

| | | |
|---|---|---|
| JP | 2004-193595 | 7/2004 |
| JP | 2004-207707 | 7/2004 |

* cited by examiner

SIZE DEPENDENCY OF WRITING CURRENT DENSITY

| SAMPLE No. | 1 | 2 | 3 | 4 | 5 | 6 | 7 | 8 | COMPARATIVE EXAMPLE |
|---|---|---|---|---|---|---|---|---|---|
| NON-MAGNETIC LAYER | Au | Zr | Hf | Rh | Pt | Ir | Ag | Al | Cu |
| SECOND MAGNETIZATION PINNED LAYER — $Co_{80}Fe_{20}$ | | 5.8 | 5.9 | 7.0 | | | | | 9.8 |
| $Ni_{90}Fe_{10}$ | 4.5 | 4.3 | 3.6 | | | | | | |
| $Fe_{75}Co_{25}$ | | | | 9.6 | 7.8 | 6.7 | | 7.8 | 9.7 |

(UNIT: $10^6 A/cm^2$)

FIG. 17

| SAMPLE No. | 1 | 2 | 3 | 4 | 5 | 6 | 7 | COMPARATIVE EXAMPLE |
|---|---|---|---|---|---|---|---|---|
| NON-MAGNETIC LAYER | Cr | Ir | Mn | V | Mo | Rh | Ru | Ru |
| SECOND MAGNETIZATION PINNED LAYER | | | | | | | | |
| $Co_{80}Fe_{20}$ | 2.8 | 2.8 | | | | | | 3.0 |
| $Ni_{90}Fe_{10}$ | 2.9 | 2.1 | 1.4 | 1.2 | | 2.9 | 1.5 | |
| $Fe_{75}Co_{25}$ | 4.2 | | | | 3.9 | | | 4.8 |

(UNIT: $10^6 A/cm^2$)

FIG. 18

SIZE DEPENDENCY OF WRITING CURRENT DENSITY

FIG. 20

| SAMPLE No. | 1 | 2 | 3 | 4 | 5 | 6 | 7 | 8 | COMPARATIVE EXAMPLE |
|---|---|---|---|---|---|---|---|---|---|
| NON-MAGNETIC LAYER / SECOND MAGNETIZATION PINNED LAYER | Au | Zr | Hf | Rh | Pt | Ir | Ag | Al | Cu |
| $Co_{80}Fe_{20}$ | | 3.6 | 3.8 | 4.1 | | | | | 6.1 |
| $Ni_{90}Fe_{10}$ | 3.2 | 2.8 | 2.1 | | | | | | 6.0 |
| $Fe_{75}Co_{25}$ | | | | 5.7 | 4.6 | 3.9 | | 4.5 | 5.8 |

(UNIT: $10^6 A/cm^2$)

| SAMPLE No. | | 1 | 2 | 3 | 4 | 5 | 6 | 7 | COMPARATIVE EXAMPLE |
|---|---|---|---|---|---|---|---|---|---|
| NON-MAGNETIC LAYER | | Cr | Ir | Mn | V | Mo | Rh | Ru | Ru |
| SECOND MAGNETIZA-TION PINNED LAYER | $Co_{80}Fe_{20}$ | 1.4 | 1.3 | | | | | | 2.0 |
| | $Ni_{90}Fe_{10}$ | | 1.0 | 0.7 | 0.5 | 1.8 | 1.5 | 0.9 | |
| | $Fe_{75}Co_{25}$ | 2.4 | | | | | | | 3.1 |

(UNIT: $10^6 A/cm^2$)

FIG. 21

CASE THAT MATERIAL FOR NON-MAGNETIC LAYER IS Mn

CASE THAT MATERIAL FOR NON-MAGNETIC LAYER IS V

CASE THAT MATERIAL FOR NON-MAGNETIC LAYER IS Rh

CASE THAT MATERIAL FOR NON-MAGNETIC LAYER IS Ru (a)

(b)

CASE THAT MATERIAL FOR NON-MAGNETIC LAYER IS Rh

CASE THAT MATERIAL FOR NON-MAGNETIC LAYER IS Rh

MAGNETO-RESISTANCE EFFECT ELEMENT AND MAGNETIC MEMORY

CROSS-REFERENCE TO RELATED APPLICATION

This application is based upon and claims the benefit of priority from prior Japanese Patent Application No. 2005-82219 filed on Mar. 22, 2005 in Japan, the entire contents of which are incorporated herein by reference.

BACKGROUND OF THE INVENTION

1. Field of the Invention

The present invention relates to a magneto-resistance effect element and a magnetic memory.

2. Related Art

It has been proposed that a magneto-resistance effect element using a magnetic material film is used not only for a magnetic head, a magnetic sensor or the like but also for a solid magnetic memory (magnetic random access memory or MRAM).

In recent years, a so-called "tunneling magneto-resistance effect element (TMR) has been proposed as a magneto-resistance effect element which has a sandwich structure film including two magnetic metal layers and one dielectric layer between positioned therebetween and which utilizes a tunnel current obtained by causing a current to flow perpendicularly to a film face of the structure film. Since the TMR element can achieve a magneto-resistance change ratio (MR ratio) of 20% or more even at room temperature, there has been growing technical developments for civilian applications to the MRAM element.

The TMR element can be realized by, after forming a thin Al (aluminum) layer with a thickness of 0.6 nm to 2.0 nm on a ferromagnetic layer, exposing a surface thereof to oxygen glow discharging or oxygen gas to form a tunnel barrier layer made of $Al_2O_3$. Recently, research and development for a TMR element using MgO (magnesium oxide) for the tunnel barrier layer have been conducted.

A ferromagnetic single tunnel junction element having a structure where an anti-ferromagnetic layer is given to one ferromagnetic layer of ferromagnetic layers sandwiching a tunnel barrier layer in ferromagnetic single tunnel junction so that the one ferromagnetic layer is utilized as a magnetization pinned layer whose magnetization has been pinned has been proposed. A ferromagnetic tunnel junction element including magnetic particles dispersed in dielectric and a ferromagnetic double tunnel junction element where a ferromagnetic film is a continuous film have been proposed.

There is a possibility of application to the MRAM even in these magneto-resistance effect elements, because the magneto-resistance change ratio of 20% to 220% has been achieved and decrease in magneto-resistance change ratio can be suppressed even when a value of a voltage applied to a TMR element is increased in order to obtain a desired output voltage value. When the TMR element is used as a memory element for a MRAM, one of ferromagnetic layers sandwiching a tunnel barrier layer is formed as a magnetization pinned layer and the other thereof is formed as a magnetic recording layer (a magnetization free layer). A memory element using the ferromagnetic single tunnel junction or the ferromagnetic double tunnel junction is non-volatile, and has such a potential that a writing/reading time is reduced to 10 nanoseconds or less and the number of rewriting times is $10^{15}$ or more.

Regarding a cell size of a memory, however, when an architecture where each memory cell includes a transistor and a TMR element is used, there is such a problem that a size of the cell can not be reduced to that of a DRAM (dynamic random access memory) made of semiconductor or less.

In order to solve the problem, a diode type architecture where a TMR element and a diode are connected in series between a bit line and a word line and a simple matrix type architecture where a TMR element is arranged between a bit line and a word line have been proposed.

In both the cases, however, since inversion of magnetization of the magnetic recording layer is performed by current magnetic filed due to current pulses at a time of writing in a magnetic recording layer, there is such a problem that power consumption is large, mass storage can not be achieved due to an allowable current density limit in writing for achieving the mass storage, a driver area for allowing current to flow becomes large.

In order to overcome the above problem, there has been proposed a solid magnetic memory where a thin film made of magnetic material with a high magnetic permeability is provided around a writing wire. According to the magnetic memory, since the magnetic film with a high magnetic permeability is provided around the writing wire, a value of a current required for information or data writing into a magnetic recording layer can be reduced efficiently. Even if such a magnetic memory is used, it is much difficult to reduce a writing current to 1 mA or less.

In order to solve these problems, a writing method utilizing a spin injection process has been proposed. This spin injection process is configured to utilize inversion of magnetization of a magnetic recording layer in the memory element performed by injecting spin-polarized current into the magnetic recording layer. In the spin-injection process, when magnetization of the magnetic recording layer is inverted by injecting spin-polarized current, when an area of a memory element is large, annular magnetic field due to the current is generated, so that inversion of magnetization does not take place.

Further, since high integration is required for application as a solid magnetic memory, it is necessary to form an element with a small area and with reduced fluctuation in area. Further, it is necessary to allow low current writing and provide a thermal stability of a magnetic recording layer to a thermal fluctuation even in cells with various sizes including a small cell with a size of $0.1 \times 0.1$ $\mu m^2$ which is a limit in thermal fluctuation tolerance.

In the conventional TMR element, however, since a current density required for spin-injection writing is high such as $10^7$ $A/cm^2$ or so, such a problem arises that a tunnel barrier layer may be destroyed. Accordingly, in order to realize stable writing without causing TMR element destruction, reduction in writing current is required. In application to the MRAM, reduction in writing current results in reduction in power consumption, the reduction in writing current is an essential technique. Incidentally, for a giant magneto-resistance (GMR) effect element, a dual pin structure has been proposed as an approach for reducing writing current by one digit without depending on a direction of the current. In the dual pin structure, orientations of magnetizations of first and second pin layers are anti-parallel to each other and a non-magnetic layer and a second pin layer constituting a spin reflection layer are respectively made of Cu and $Co_{90}Fe_{10}$ so that it is made possible to reduce inverted current densities for magnetization inversion due to spin injection to $6 \times 10^6$ $A/cm^2$ or so (see 49th MMM conference digest HA-05, for example). However, further reduction in current density is required for memory application.

As explained above, the current density required for spin injection writing is as high as $6 \times 10^6$ A/cm$^2$ or so in the conventional tunnel magneto-resistance (TMR) effect element, which leaves the problem about the reduction in current density.

SUMMARY OF THE INVENTION

In view of these circumstances, an object of the present invention is to provide a magneto-resistance effect element and a magnetic memory where a current required for spin injection writing is low.

A magneto-resistance effect element according to a first aspect of the present invention includes: a first magnetization pinned layer whose direction of magnetization is fixed; a magnetization free layer whose direction of magnetization is variable; a tunnel barrier layer which is provided between the first magnetization pinned layer and the magnetization free layer; a second magnetization pinned layer which is provided on the opposite side of the magnetization free layer from the tunnel barrier layer and whose direction of magnetization is pinned to be substantially anti-parallel to the direction of magnetization of the first magnetization pinned layer, and; a non-magnetic layer which is provided between the magnetization free layer and the second magnetization pinned layer, a direction of magnetization of the magnetization free layer being made variable when a current is caused to flow between the first magnetization pinned layer and the second magnetization pinned layer, wherein when the second magnetization pinned layer is made of ferromagnetic material including Co, material for the non-magnetic layer is metal including at least one element selected from the group consisting of Zr, Hf, Rh, Ag, and Au; when the second magnetization pinned layer is made of ferromagnetic material including Fe, material for the non-magnetic layer is metal including at least one element selected from the group consisting of Rh, Pt, Ir, Al, Ag, and Au; and when the second magnetization pinned layer is made of ferromagnetic material including Ni, material for the non-magnetic layer is metal including at least one element selected from the group consisting of Zr, Hf, Au, and Ag.

When the non-magnetic layer includes at least one element selected from the group consisting of Ag and Au, the second magnetization pinned layer can be made of one of Co—Fe alloy, Co—Ni alloy, and Fe—Ni alloy, and when the non-magnetic layer includes Rh, material for the second magnetization pinned layer can be made of Co—Fe alloy.

A magneto-resistance effect element according to a second aspect of the present invention includes: a first magnetization pinned layer whose direction of magnetization is pinned; a magnetization free layer whose direction of magnetization is variable; a tunnel barrier layer which is provided between the first magnetization pinned layer and the magnetization free layer; a second magnetization pinned layer which is provided on the opposite side of the magnetization free layer from the tunnel barrier layer and whose direction of magnetization is pinned to be substantially parallel to the direction of magnetization of the first magnetization pinned layer, and; a non-magnetic layer which is provided between the magnetization free layer and the second magnetization pinned layer, a direction of magnetization of the magnetization free layer being made variable when a current is caused to flow between the first magnetization pinned layer and the second magnetization pinned layer, wherein when the second magnetization pinned layer is made of ferromagnetic material including Co, material for the non-magnetic layer is metal including at least one element selected from the group consisting of Mn, V, and Rh; when the second magnetization pinned layer is made of ferromagnetic material including Fe, material for the non-magnetic layer is metal including at least one element selected from the group consisting of Ir and Rh; and when the second magnetization pinned layer is made of ferromagnetic material including Ni, material for the non-magnetic layer is metal including Mn.

A magneto-resistance effect element according to a third aspect of the present invention includes: a first magnetization pinned layer whose direction of magnetization is pinned; a magnetization free layer whose direction of magnetization is variable; a tunnel barrier layer which is provided between the first magnetization pinned layer and the magnetization free layer; a second magnetization pinned layer which is provided on the opposite side of the magnetization free layer from the tunnel barrier layer and whose direction of magnetization is pinned to be substantially parallel to the direction of magnetization of the first magnetization pinned layer, and; a non-magnetic layer which is provided between the magnetization free layer and the second magnetization pinned layer, a direction of magnetization of the magnetization free layer being made variable when a current is caused to flow between the first magnetization pinned layer and the second magnetization pinned layer, wherein the non-magnetic layer includes Cr; and the second magnetization pinned layer has one of the following compositions $0.5 \leq x \leq 1$; $Co_xFe_{1-x}$,
$0 \leq y \leq 1$; $Co_yNi_{1-y}$, and
$0 \leq z \leq 0.475$; $Fe_zNi_{1-z}$.

A magneto-resistance effect element according to a fourth aspect of the present invention includes: a first magnetization pinned layer whose direction of magnetization is pinned; a magnetization free layer whose direction of magnetization is variable; a tunnel barrier layer which is provided between the first magnetization pinned layer and the magnetization free layer; a second magnetization pinned layer which is provided on the opposite side of the magnetization free layer from the tunnel barrier layer and whose direction of magnetization is pinned to be substantially parallel to the direction of magnetization of the first magnetization pinned layer, and; a non-magnetic layer which is provided between the magnetization free layer and the second magnetization pinned layer, a direction of magnetization of the magnetization free layer being made variable when a current is caused to flow between the first magnetization pinned layer and the second magnetization pinned layer, wherein the non-magnetic layer includes Ir; and the second magnetization pinned layer has one of the following compositions $0.3 \leq x \leq 1$; $Co_xFe_{1-x}$,
$0 \leq y \leq 1$; $Co_yNi_{1-y}$, and
$0 \leq z \leq 0.7$; $Fe_zNi_{1-z}$.

A magneto-resistance effect element according to a fifth aspect of the present invention includes: a first magnetization pinned layer whose direction of magnetization is pinned; a magnetization free layer whose direction of magnetization is variable; a tunnel barrier layer which is provided between the first magnetization pinned layer and the magnetization free layer; a second magnetization pinned layer which is provided on the opposite side of the magnetization free layer from the tunnel barrier layer and whose direction of magnetization is pinned to be substantially parallel to the direction of magnetization of the first magnetization pinned layer, and; a non-magnetic layer which is provided between the magnetization free layer and the second magnetization pinned layer, a direction of magnetization of the magnetization free layer being made variable when a current is caused to flow between the first magnetization pinned layer and the second magnetization pinned layer, wherein the non-magnetic layer includes Mn; and the second magnetization pinned layer has one of the following composition $0 \leq x \leq 0.64$; $Co_X Fe_{1-X}$, and $0.4 \leq z \leq 1.0$; $Fe_Z Ni_{1-Z}$.

A magneto-resistance effect element according to a sixth aspect of the present invention includes: a first magnetization pinned layer whose direction of magnetization is pinned; a magnetization free layer whose direction of magnetization is variable; a tunnel barrier layer which is provided between the first magnetization pinned layer and the magnetization free layer; a second magnetization pinned layer which is provided on the opposite side of the magnetization free layer from the tunnel barrier layer and whose direction of magnetization is pinned to be substantially parallel to the direction of magnetization of the first magnetization pinned layer, and; a non-magnetic layer which is provided between the magnetization free layer and the second magnetization pinned layer, a direction of magnetization of the magnetization free layer being made variable when a current is caused to flow between the first magnetization pinned layer and the second magnetization pinned layer, wherein the non-magnetic layer includes V; and the second magnetization pinned layer has one of the following compositions $0 \leq x \leq 0.64$; $Co_X Fe_{1-X}$, and $0.375 \leq z \leq 1.0$; $Fe_Z Ni_{1-Z}$.

A magneto-resistance effect element according to a seventh aspect of the present invention includes: a first magnetization pinned layer whose direction of magnetization is pinned; a magnetization free layer whose direction of magnetization is variable; a tunnel barrier layer which is provided between the first magnetization pinned layer and the magnetization free layer; a second magnetization pinned layer which is provided on the opposite side of the magnetization free layer from the tunnel barrier layer and whose direction of magnetization is pinned to be substantially parallel to the direction of magnetization of the first magnetization pinned layer, and; a non-magnetic layer which is provided between the magnetization free layer and the second magnetization pinned layer, a direction of magnetization of the magnetization free layer being made variable when a current is caused to flow between the first magnetization pinned layer and the second magnetization pinned layer, wherein the non-magnetic layer includes Rh; and the second magnetization pinned layer has one of the following compositions $0 \leq x \leq 0.62$; $Co_X Ni_{1-X}$, and $0 \leq z \leq 0.63$; $Fe_Z Ni_{1-Z}$.

A magneto-resistance effect element according to an eighth aspect of the present invention includes: a first magnetization pinned layer whose direction of magnetization is pinned; a magnetization free layer whose direction of magnetization is variable; a tunnel barrier layer which is provided between the first magnetization pinned layer and the magnetization free layer; a second magnetization pinned layer which is provided on the opposite side of the magnetization free layer from the tunnel barrier layer and whose direction of magnetization is pinned to be substantially parallel to the direction of magnetization of the first magnetization pinned layer, and; a non-magnetic layer which is provided between the magnetization free layer and the second magnetization pinned layer, a direction of magnetization of the magnetization free layer being made variable when a current is caused to flow between the first magnetization pinned layer and the second magnetization pinned layer, wherein the non-magnetic layer includes Ru; and the second magnetization pinned layer has one of the following compositions $0 \leq x \leq 1.0$; $Co_X Ni_{1-X}$, and $0 \leq z \leq 0.8$; $Fe_Z Ni_{1-Z}$.

The magnetization free layer can be a layer having at least two ferromagnetic particles isolated by dielectric or insulator or a layer having a column-shaped structure with a diameter of 1 nm to 100 nm or so made of ferromagnetic material.

A magnetic memory according to a ninth aspect of the present invention includes: a memory cell having the magneto-resistance effect element according to any one of above-described; a first wiring electrically connected with one end of the magneto-resistance effect element; and a second wiring electrically connected with the other end of the magneto-resistance effect element.

When two or more elements of Co, Fe, and Ni is contained in the second magnetization pinned layer, elements to be contained in the non-magnetic layer is determined considering the most element of these elements preferentially. When there are two or more most elements, the respective elements should be considered preferentially. Of course, it is preferable that elements to be contained in the non-magnetic layer are determined considering the two or more elements of Co, Fe, and Ni, respectively.

In this text, the "metal" includes not only a simple metal but also an alloy.

BRIEF DESCRIPTION OF THE DRAWINGS

FIG. 17 is a table showing current densities required for spin writing in respective combinations of materials for a non-magnetic layer and a second magnetization pinned layer in a magneto-resistance effect element according to Example 2 of the invention;

FIG. 18 is a table showing current densities for spin writing in respective combinations of materials for a non-magnetic layer and a second magnetization pinned layer in a magneto-resistance effect element according to Example 3 of the invention;

FIG. 20 is a table showing current densities for spin writing in respective combinations of materials for a non-magnetic layer and a second magnetization pinned layer in a magneto-resistance effect element according to Example 5 of the invention;

FIG. 21 is a table showing current densities for spin writing in respective combinations of materials for a non-magnetic layer and a second magnetization pinned layer in a magneto-resistance effect element according to Example 6 of the invention;

DETAILED DESCRIPTION OF THE INVENTION

Embodiments of the present invention will be explained below with reference to the drawings.

First Embodiment

Figure 1:
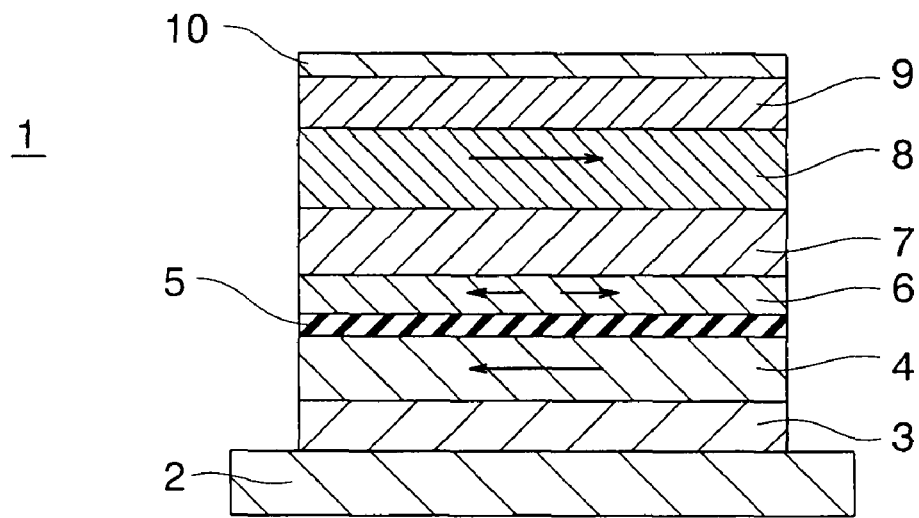
FIG. 1 is a sectional view of a magneto-resistance effect element according to a first embodiment of the present invention.

A magneto-resistance effect element according to a first embodiment of the invention is shown in FIG. 1. A magneto-resistance effect element 1 of the embodiment is provided with a base layer 2 serving as a lower electrode, an anti-ferromagnetic layer 3 provided on the base layer 2, a first magnetization pinned layer 4 which is provided on the anti-ferromagnetic layer 3 and has whose direction of magnetization is pinned; a tunnel barrier layer 5 which is provided on the first magnetization pinned layer 4, a magnetization free layer 6 which is provided on the tunnel barrier layer 5 so as to serve as a magnetic recording layer and whose direction of magnetization is variable, a non-magnetic layer 7 which is provided on the magnetic recording layer 6, a second magnetization pinned layer 8 which is provided on the non-magnetic layer 7 and has pinned magnetization whose direction is different from that of the first magnetization pinned layer 4 by an angle of 180°, an anti-ferromagnetic layer 9 which is provided on the second magnetization pinned layer 8, and an electrode layer 10 which is provided on the anti-ferromagnetic layer 9 so as to serve as an upper electrode, where a current is caused to flow between the lower base layer 2 and the upper electrode 10. Magnetization of the first magnetization pinned layer 4 is pinned by exchange coupling between the first magnetization pinned layer 4 and the anti-ferromagnetic layer 3. Magnetization of the second magnetization pinned layer 8 is pinned by exchange coupling between the second magnetization pinned layer 8 and the anti-ferromagnetic layer 9. In the magneto-resistance effect element according to the embodiment, the tunnel barrier layer 5, the magnetic recording layer 6, and the like are continuous films.

In the magneto-resistance effect element 1 of the embodiment thus constituted, the first magnetization pinned layer 4 and the second magnetization pinned layer 8 has property of reflecting spin-polarized electrons. Here, by using material for the non-magnetic layer 7 selectively, electrons spin-polarized in a direction inverted to the direction of the second magnetization pinned layer can be reflected efficiently.

Figure 2:
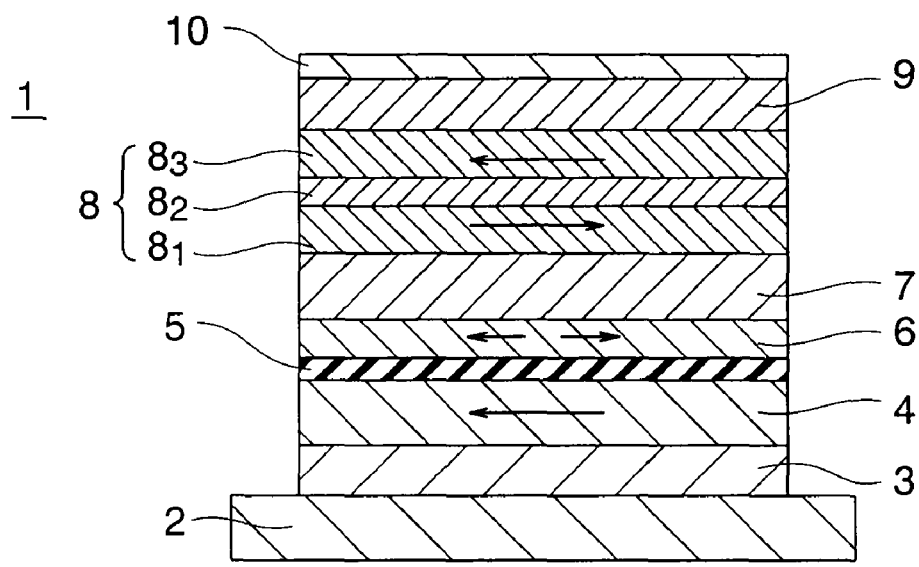
FIG. 2 is a sectional view of a magneto-resistance effect element according to a modification of the first embodiment.

In order to perform such setting that the first magnetization pinned layer 4 and the second magnetization pinned layer 8 are different from each other by an angle of 180°, as shown in FIG. 1, a method can be employed which applies anti-ferromagnetic layers 3, 9 whose Neel temperatures are different from each other to the magnetization pinned layers 4, 8 and inverts a magnetic field applying direction by an angle of 180° at a proper temperature between the Neel temperatures of the layers 3, 9 in cooling process after annealing in a magnetic field. As shown in FIG. 2, by applying, to the second magnetization pinned layer 8, a synthetic anti-ferromagnetic structure (also called "SAF (synthetic-anti-ferromagnetic) structure"), namely, a structure where a non-magnetic layer $8_2$ is sandwiched between at least two ferromagnetic layers $8_1$, $8_3$ coupled in an anti-ferromagnetic manner, arrangement where directions of magnetizations of the first magnetization pinned layer 4 and the ferromagnetic layer $8_1$ of the second magnetization pinned layer 8 are different from each other by an angle of 180° can be realized without using the anneal process.

In the embodiment, when spin moment (magnetization) of the magnetic recording layer 6 to the first magnetization pinned layer 4 is spin-inverted from anti-parallel to parallel, electrons spin-polarized in the first magnetization pinned layer 4 tunnels through the tunnel barrier layer 5 according to injection of electrons from the first magnetization pinned layer 4 side into the magnetic recording layer 6, thereby applying spin torque to the magnetic recording layer 6. At that time, since electron spin-polarized flows from the magnetic recording layer 6 to the second magnetization pinned layer 8 via the non-magnetic layer 7, the spins in the magnetic recording layer 6 and the second magnetization pinned layer 8 are parallel while the spin in the magnetic recording layer 6 is anti-parallel to the spin in the first magnetization pinned layer 4, so that reflection spin electrons reflected by the second magnetization pinned layer 8 apply spin torque to the magnetic recording layer 6 and spin in the magnetic recording layer 6 to spin in the first magnetization pinned layer 4 is inverted from anti-parallel to parallel. Direction of the spin in the magnetic recording layer 6 varies due to the two spin torques.

In the embodiment, when spin moment of the magnetic recording layer 6 to the first magnetization pinned layer 4 is spin-inverted from parallel to anti-parallel, electrons spin-polarized in the second magnetization pinned layer 8 pass through the non-magnetic layer 7 to flow into the magnetic recording layer 6 according to injection of electrons from the second magnetization pinned layer 8 to the magnetic recording layer 6, thereby applying spin torque to the magnetic recording layer 6. At that time, though the electrons spin-polarized try to tunnel through the tunnel barrier layer 5 to flow into the first magnetization pinned layer 4, electrons having the same spin direction as that in the first magnetization pinned layer 4 flow easily owing to a high tunneling property but electrons having anti-parallel spin direction are reflected. Electrons reflected to the magnetic recording layer 6 apply spin torque to the magnetic recording layer 6, so that spin in the magnetic recording layer 6 is inverted from parallel to anti-parallel by the two spin torques.

Accordingly, in the magneto-resistance effect element 1 of the embodiment, it is made possible to perform spin injection writing by changing current flow direction, so that writing of "1" and "0" can be performed.

In the embodiment, the inventors have found that preferable combinations of the non-magnetic layer 7 and the second magnetization pinned layer 8 when orientations of magnetizations of the magnetization pinned layers 4, 8 are substantially anti-parallel include the following combinations of materials. Specifically, when the second magnetization pinned layer 8 is made of Co-rich ferromagnetic material, it is preferable that material for the non-magnetic layer 7 is metal including at least one element selected from the group consisting of Zr, Hf, Rh, Ag, and Au.

When the second magnetization pinned layer 8 is made of Fe-rich ferromagnetic material, it is preferable that material for the non-magnetic layer 7 is metal including at least one element selected from the group consisting of Rh, Pt, Ir, Al, Ag, and Au.

When the second magnetization pinned layer 8 is made of Ni-rich ferromagnetic material, it is preferable that material for the non-magnetic layer 7 is at least one element selected from the group consisting of Zr, Hf, Au, and Ag.

As shown in FIG. 2, though the case that the second magnetization pinned layer 8 has the SAF structure has been explained as a modification of the embodiment, the first magnetization pinned layer 4 may have the SAF structure, or both the first and second magnetization pinned layers 4, 8 may have the SAF structure. By using the SAF structure, a reliable magneto-resistance effect element where properties of the magnetization pinned layer are made stable can be obtained.

Second Embodiment

Figure 3:
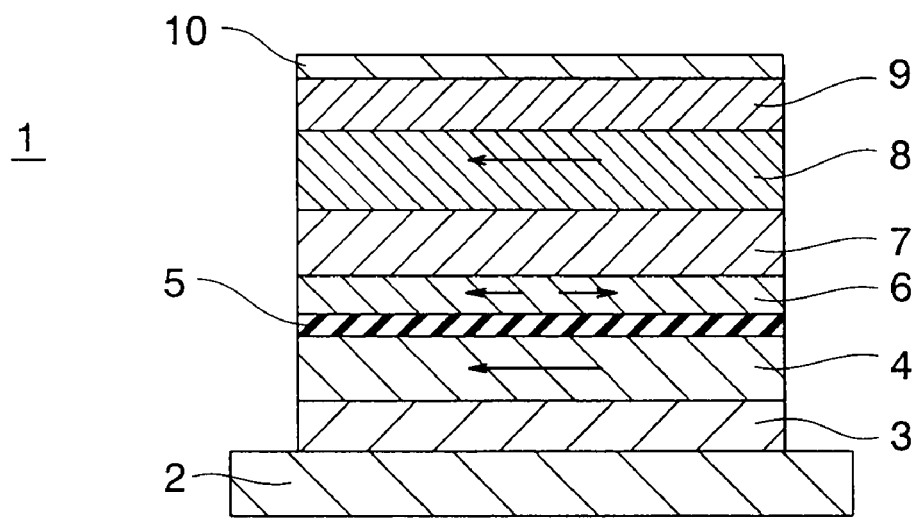
FIG. 3 is a sectional view of a magneto-resistance effect element according to a second embodiment of the invention.

Next, a magneto-resistance effect element according to a second embodiment of the invention is shown in FIG. 3. A magneto-resistance effect element 1 of the embodiment is configured such that an orientation of magnetization of the second magnetization pinned layer 8 becomes substantially parallel to that of the first magnetization pinned layer 4 in the magneto-resistance effect element according to the first embodiment shown in FIG. 1.

As the embodiment, the inventors have found that preferable combinations of the non-magnetic layer 7 and the second magnetization pinned layer 8 when orientations of magnetizations of the magnetization pinned layers 4, 8 are substantially parallel include the following combinations of materials. Specifically, when the second magnetization pinned layer 8 is made of Co-rich ferromagnetic material, material for the non-magnetic layer 7 is at least one element selected from the group consisting of Cr, Ir, Mn, V, Rh, and Ru.

When the second magnetization pinned layer 8 is made of Fe-rich ferromagnetic material, it is preferable that material for the non-magnetic layer 7 is metal including at least one element selected from the group consisting of Mn, Cr, V, Mo, Ir, Rh, and Ru.

When the second magnetization pinned layer 8 is made of Ni-rich ferromagnetic material, it is preferable that material for the non-magnetic layer 7 is at least one element selected from the group consisting of Cr, Rh, Ru, Ir, Mn, and V. By using either one of these combinations, a current at a spin writing time can be reduced.

Modification

Figure 4:
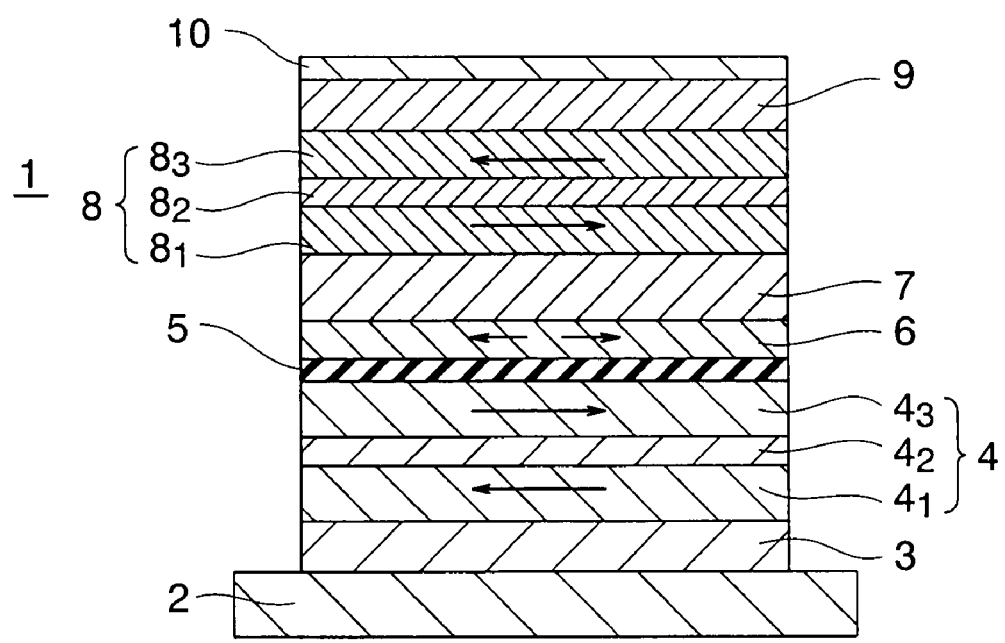
FIG. 4 is a sectional view of a magneto-resistance effect element according to a modification of the second embodiment.

In the embodiment, an SAF structure can be adopted as first and second magnetization pinned layers, as shown in FIG. 4.

That is, such a configuration may be employed that a first magnetization pinned layer 4 has a structure where a non-magnetic layer $4_2$ is sandwiched between ferromagnetic layers $4_1$ and $4_3$ coupled in an anti-ferromagnetic manner and a second magnetization pinned layer 8 has a structure where a non-magnetic layer $8_2$ is sandwiched between ferromagnetic layers $8_1$ and $8_3$ coupled in an anti-ferromagnetic manner. In that case, as shown in FIG. 4, orientations of magnetizations of the ferromagnetic layers $4_3$, $8_1$ in the first and second magnetization pinned layers nearest to the magnetic recording layer 6 are substantially parallel. By using the SAF structure, a reliable magneto-resistance effect element where properties of the magnetization pinned layers 4, 8 are stabilized can be obtained. In the modification, both the first and second magnetization pinned layers have the SAF structure, but either one thereof may have the SAF structure.

Third Embodiment

Figure 5:
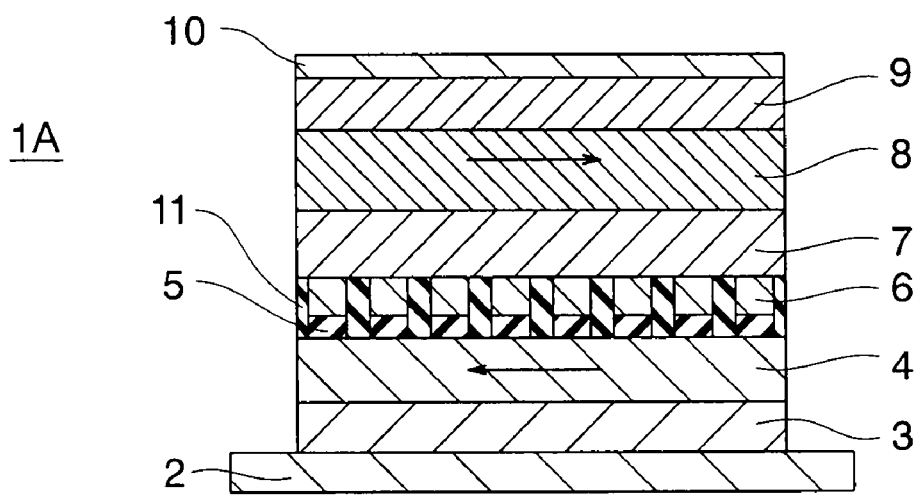
FIG. 5 is a sectional view of a magneto-resistance effect element according to a third embodiment of the invention.

Next, a magneto-resistance effect element according to a third embodiment of the invention is shown in FIG. 5. In each of the magneto-resistance effect elements according to the first and second embodiments, the tunnel barrier layer 5, the magnetic recording layer 6, and the like were the continuous films. A magneto-resistance effect element 1A according to the embodiment includes a column-shaped stacked structure portion obtained by stacking a tunnel barrier layer 5 and a magnetic recording layer 6 on one another, and it has a configuration that a plurality of the column-shaped stacked structure portions are provided on the first magnetization pinned layer 4 so as to be spaced from one another. The plurality of the column-shaped stacked structure portions are insulated from one another by insulators 11. A non-magnetic layer 7, a second magnetization pinned layer 8, an anti-ferromagnetic layer 9, and an electrode layer 10 are stacked on the column-shaped structure portions. The tunnel barrier layers 5 are provided on a first magnetization pinned layer 4, the first magnetization pinned layer 4 is provided on an anti-ferromagnetic layer 3, and the anti-ferromagnetic layer 3 is provided on a base layer 2. In the embodiment, the magnetic layer 6 on each column-shaped stacked structure portion may be made of a ferromagnetic particle. In this case, respective ferromagnetic particles 6 are spaced from one another by the insulators 11.

In the embodiment, an orientation of the magnetization of the second magnetization pinned layer 8 is pinned to be different from that of magnetization of the first magnetization pinned layer 4 by an angle of about 180°, that is, the former is anti-parallel to the latter like the first embodiment. Accordingly, as explained in the first embodiment, by using, as the non-magnetic layer 7, material selected corresponding to material for the second magnetization pinned layer 8, a current at a spin writing time can be reduced.

In the magneto-resistance effect element 1A of the embodiment thus constituted, since an effective junction area of ferromagnetic tunnel junction is defined by projection areas of the plurality of magnetic recording layers 6 to the first magnetization pinned layer 4 in a direction perpendicular to a film face thereof, the effective junction area is reduced as compared with the case that the magnetic recording film 6 is the continuous film made of ferromagnetic material. Therefore, even if current spin-polarized is caused to flow at a writing time, annular magnetic field due to the writing current is not generated, so that magnetization can be stably inverted even in a magnetic recording layer with a large element size and a writing operation can be performed steadily.

It is desirable that a size of the column-shaped structure has a diameter in a range of 1 nm to 100 nm or so. When the diameter of the column-shaped structure is less than 1 nm, stable writing can not be achieved due to super-paramagnetization of ferromagnetic material (the magnetic recording layer 6 in this embodiment) in the column-shaped structure. When the diameter exceeds 100 nm, since a reflux magnetic domain structure is made more stable than a simple magnetic domain structure, stable writing can not be performed and a harmful effect such as MR ratio reduction also occurs.

It is preferable that a volume of the magnetic material with the column-shaped structure is in a range of 1500 $nm^3$ to 160000 $nm^3$ or so. When the volume of the magnetic material with the column-shaped structure is smaller than 1500 $nm^3$, stable writing can not be performed due to super-paramagnetization of the ferromagnetic material with the column-shaped structure. When the volume exceeds 160000 $nm^3$, since a reflux magnetic domain structure is made more stable than a simple magnetic domain structure, stable writing can not be performed and a harmful effect such as MR ratio reduction also occurs.

In the embodiment, the column-shaped stacked structure portion is constituted of the magnetic recording layer 6 and the tunnel barrier layer 5, but it may include the non-magnetic layer 7, the second magnetization pinned layer 8, the anti-ferromagnetic layer 9, and the electrode layer 10, and it may include a portion of the first magnetization pinned layer 4. Alternatively, the column-shaped stacked structure portion may include only a portion of the magnetic recording layer 6, and it may include the magnetic recording layer 6 and a portion of the tunnel barrier layer 5.

First Modification

Figure 6:
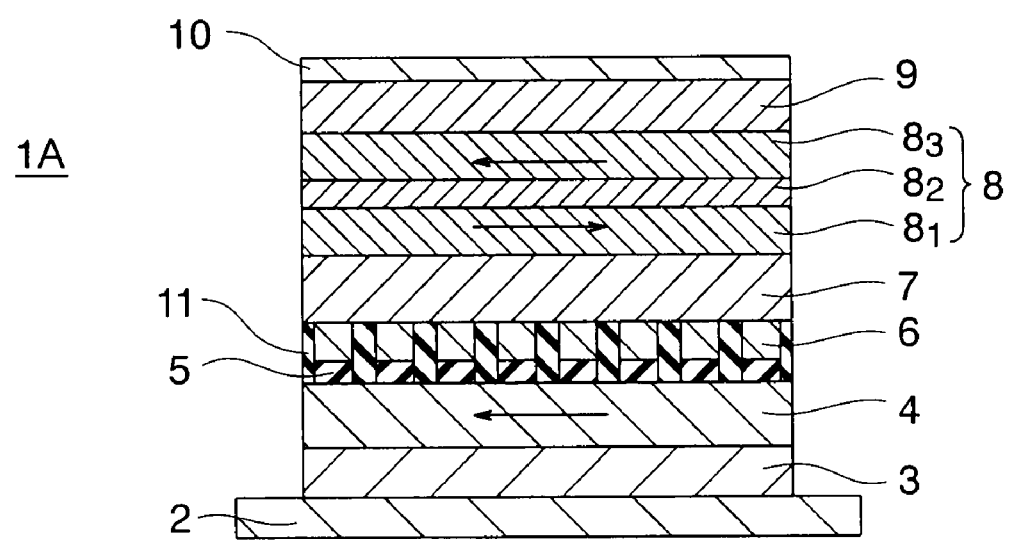
FIG. 6 is a sectional view of a magneto-resistance effect element according to a first modification of the third embodiment.

Next, a magneto-resistance effect element according to a first modification of the embodiment is shown in FIG. 6. A magneto-resistance effect element 1A according the first modification is configured such the second magnetization pinned layer 8 has the SAF structure in the third embodiment shown in FIG. 5. That is, the second magnetization pinned layer 8 has a structure that a non-magnetic layer $8_2$ is sandwiched between ferromagnetic layers $8_1$ and $8_3$ coupled in an anti-ferromagnetic manner. Orientations of magnetizations of the first magnetization pinned layer 4 and the ferromagnetic layer $8_1$ are substantially anti-parallel to each other. By using the SAF structure, a reliable magneto-resistance effect element where property of the magnetization pinned layer 8 is stabled can be obtained. In the first modification, the second magnetization pinned layer has the SAF structure, but the first magnetization pinned layer 4 may have the SAF structure and both the first and second magnetization pinned layers have the SAF structure.

Of course, the modification can achieve an advantage similar to that in the third embodiment.

Second Modification

Figure 7:
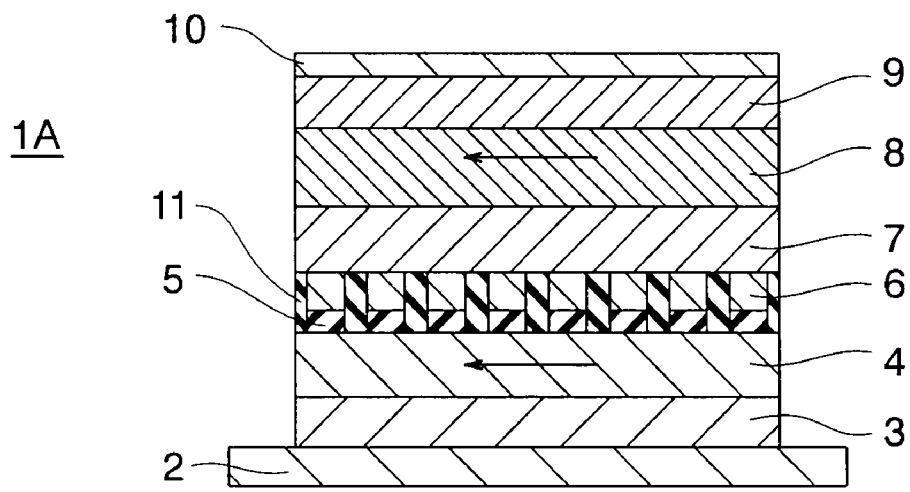
FIG. 7 is a sectional view of a magneto-resistance effect element according to a second modification of the third embodiment.

Next, a magneto-resistance effect element according to a second modification of the embodiment is shown in FIG. 7. A magneto-resistance effect element 1A according to the second modification is configured such that orientations of magnetizations of the first and second magnetization pinned layers 4, 8 are set to be substantially parallel to each other in the third embodiment shown in FIG. 5. Accordingly, by using material for the non-magnetic layer 7 selected corresponding to material for the second magnetization pinned layer 8, a current at a pin-writing time can be reduced, as explained in the second embodiment.

Of course, the modification can achieve an advantage similar to that in the third embodiment.

Third Modification

Figure 8:
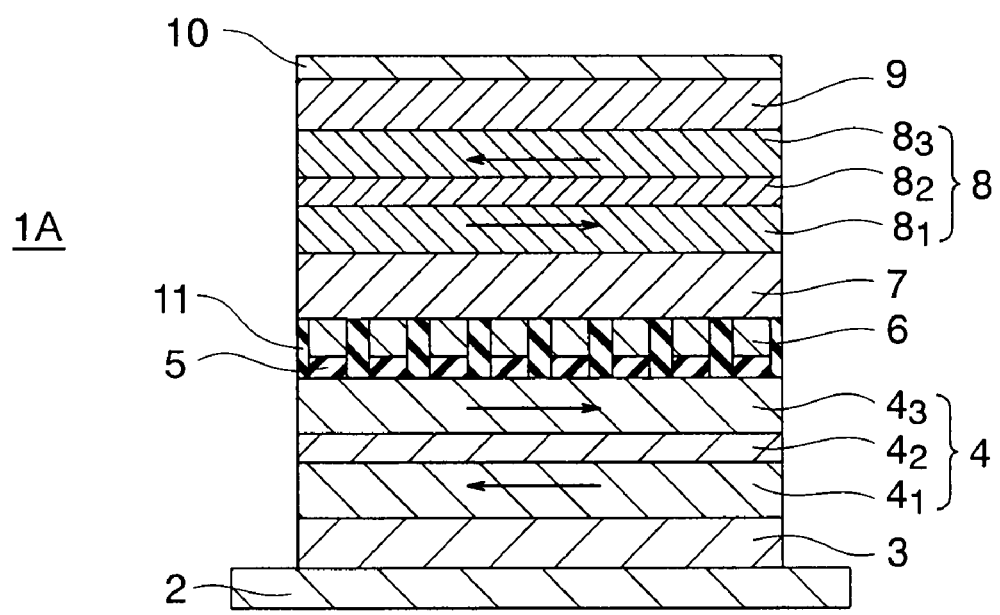
FIG. 8 is a sectional view of a magneto-resistance effect element according to a third modification of the third embodiment.

Next, a magneto-resistance effect element according to a third modification of the embodiment is shown in FIG. 8. A magneto-resistance effect element 1A according to the second modification is configured such that the first and second magnetization pinned layers 4, 8 have the SAF structure in the second modification shown in FIG. 7. That is, the first magnetization pinned layer 4 has a structure that a non-magnetic layer $4_2$ is sandwiched between ferromagnetic layers $4_1$ and $4_3$ coupled in an anti-ferromagnetic manner, and the second magnetization pinned layer 8 has a structure that a non-magnetic layer $8_2$ is sandwiched between ferromagnetic layers $8_1$ and $8_3$ coupled in an anti-ferromagnetic manner. Orientations of magnetizations of the ferromagnetic layers $4_3$, $8_1$ in the first and second magnetization pinned layers 4 and 8 nearest to the magnetic recording layer 6 are set to be substantially parallel to each other. By using the SAF structure, a reliable magneto-resistance effect element where properties of the magnetization pinned layers 4, 8 are stabilized can be obtained. In the modification, both the first and second magnetization pinned layers have the SAF structure, but one thereof may have the SAF structure.

Of course, the modification can achieve an advantage similar to that in the third embodiment.

Fourth Embodiment

Next, a method for manufacturing a magneto-resistance effect element according to a fourth embodiment of the invention will be explained with reference to FIGS. 9A to 13B. A manufacturing method of the embodiment corresponds to a method for manufacturing the magneto-resistance effect element explained in the third embodiment, and respective manufacturing steps thereof are shown in FIGS. 9A to 13B. The manufacturing method of this embodiment utilizes a manufacturing process of a patterned media.

Figure 9A:
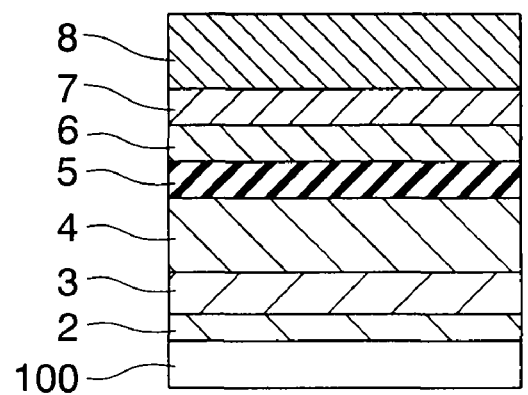
FIGS. 9A to 9C are sectional views showing manufacturing steps in a method for manufacturing a magneto-resistance effect element according to a fourth embodiment of the invention.
Figure 9B:
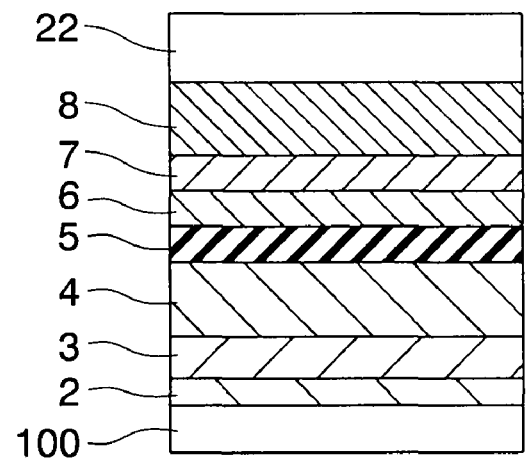
Figure 9C:
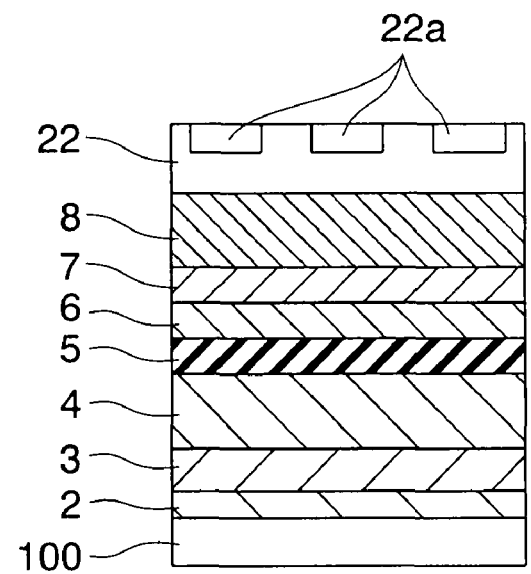

As shown in FIG. 9A, first, a base layer 2, an anti-ferromagnetic layer 3, a ferromagnetic layer 4 whose magnetization has been pinned, a tunnel barrier layer 5, a ferromagnetic layer 6, a non-magnetic layer 7, and a ferromagnetic layer 8 are stacked on a non-magnetic substrate 100. Thereafter, as shown in FIG. 9B, a film of material obtained by dissolving diblock copolymer 22 in organic solvent is formed by spin coating process.

Next, a long time annealing is performed in vacuum for 30 hours at a temperature in a range of 140° C. to 200° C. The diblock copolymer 22 causes phase separation due to self-organization during annealing, so that island structures constituted of diblock copolymer portions 22a with a size in a range of 15 nm to 30 nm are aligned at intervals of several tens nm (see FIG. 9C).

Thereafter, exposure to oxygen plasma is performed to selectively remove only the diblock copolymer portions 22a. Holes 24 are formed in portions from which the diblock copolymer portions 22a have been removed (see FIG. 10A).

Figure 10A:
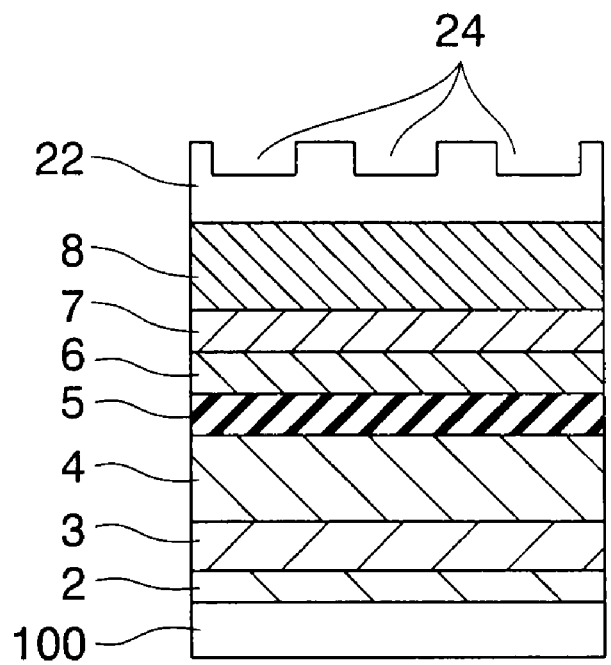
FIGS. 10A and 10B are sectional views showing manufacturing steps in the method for manufacturing a magneto-resistance effect element according to the fourth embodiment of the invention.
Figure 10B:
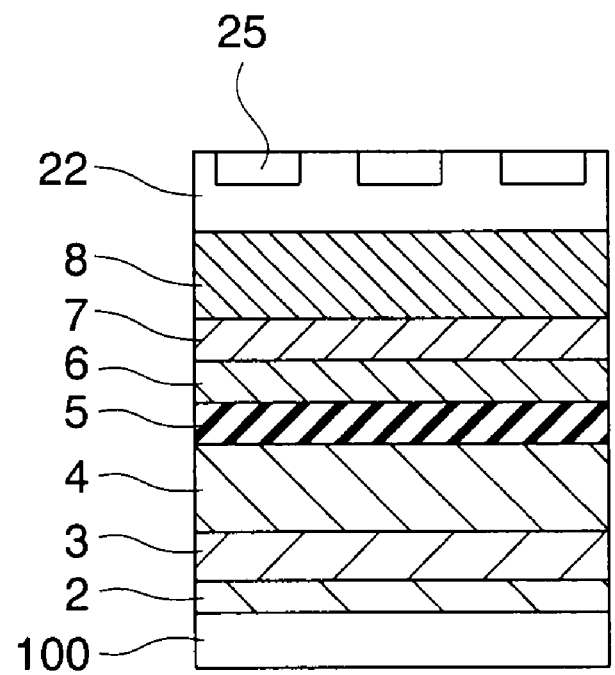

Next, when SOG (spin on glass) diluted with lactic acid is applied by a spin coating process, SOG 25 is filled in the holes 24 (see FIG. 10B).

Figure 11A:
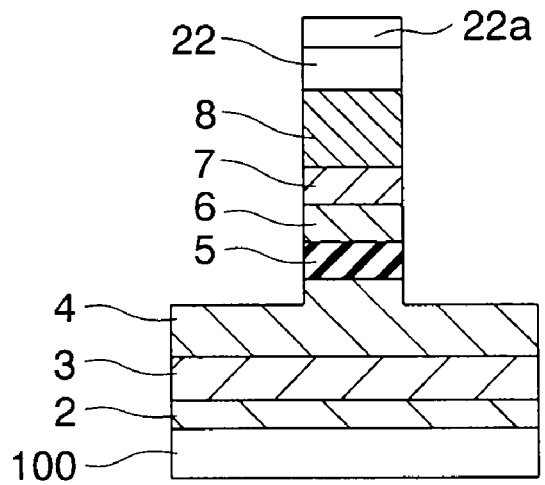
FIGS. 11A to 11C are sectional views showing manufacturing steps in the method for manufacturing a magneto-resistance effect element according to the fourth embodiment of the invention.
Figure 13A:
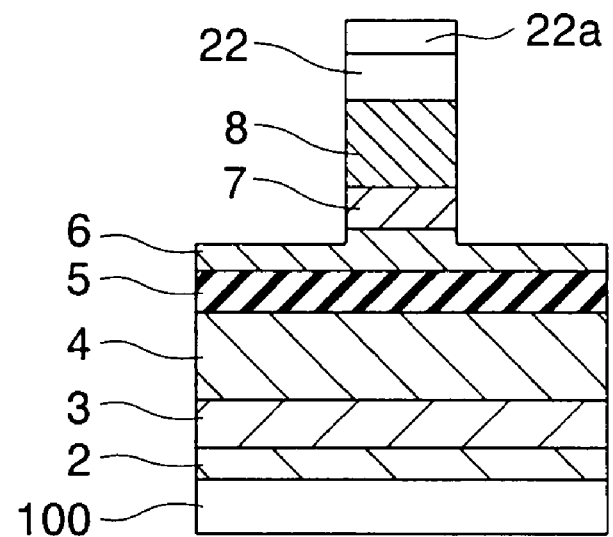
FIGS. 13A and 13B are sectional views showing views showing manufacturing steps in a method for manufacturing a magneto-resistance effect element according to a modification of the fourth embodiment.
Figure 13B:
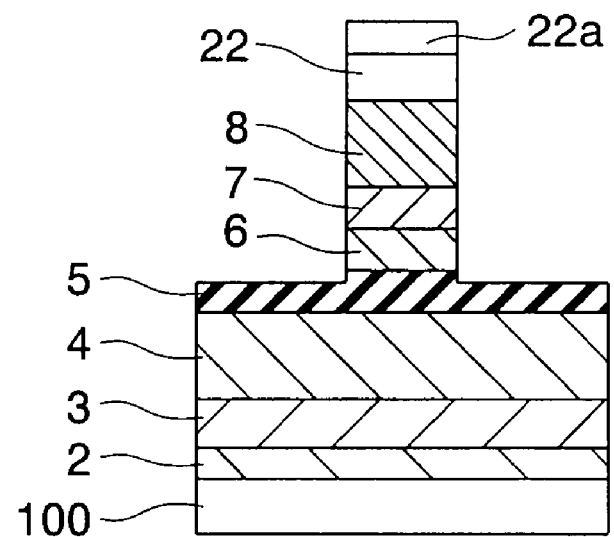

Using etching masks made of SOG 25, patterning is performed down to an intermediate portion of the ferromagnetic layer 4 by an ion milling process, as shown in FIG. 11A. In FIG. 11A, only one island structure constituted of the diblock copolymer portion 22a is shown for simplification in explanation. It is unnecessary to perform the ion milling process down to the intermediate portion of the ferromagnetic layer 4 necessarily, but the ion milling process may be performed down to an intermediate portion of the ferromagnetic layer 6, as shown in FIG. 13A, or it may be performed down to an intermediate portion of the tunnel barrier layer 5, as shown in FIG. 13B.

The pattern forming method utilizing the self-organizing phenomenon allows formation of a pattern with a large area in a short period of time inexpensively as compared with, for example, EB irradiating process, photolithography, X-ray lithography, near-field photolithography, interference exposure process, and FIB (focused ion beam) process. The island structure has a diameter in a range of 15 nm to 80 nm or so, and a size satisfying the above-described conditions can be realized in this manner.

Figure 11B:
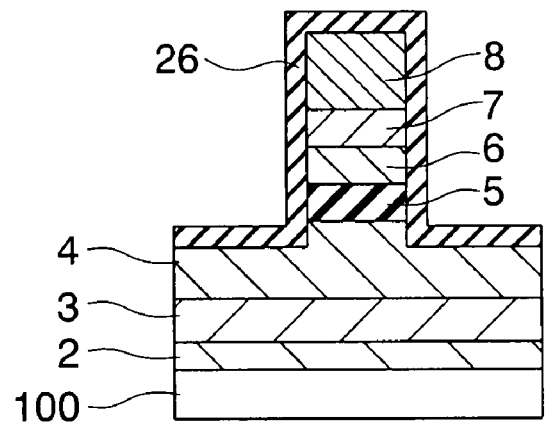

After the etching masks are removed, a protective film 26 made of $AlO_X$ or $SiO_X$ is formed immediately (see FIG. 11B).

Figure 11C:
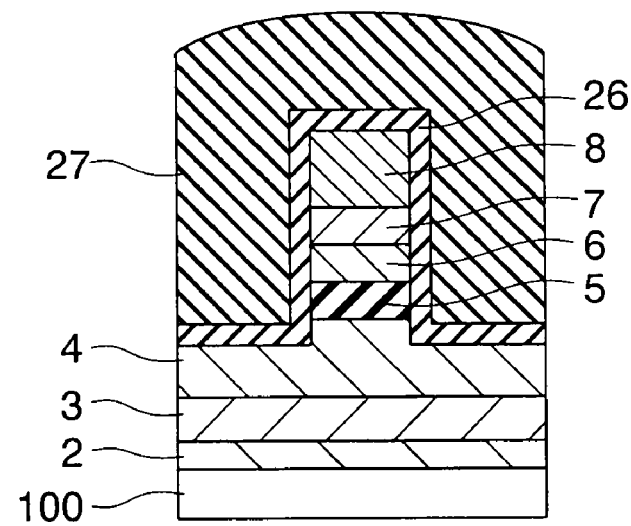
Figure 12A:
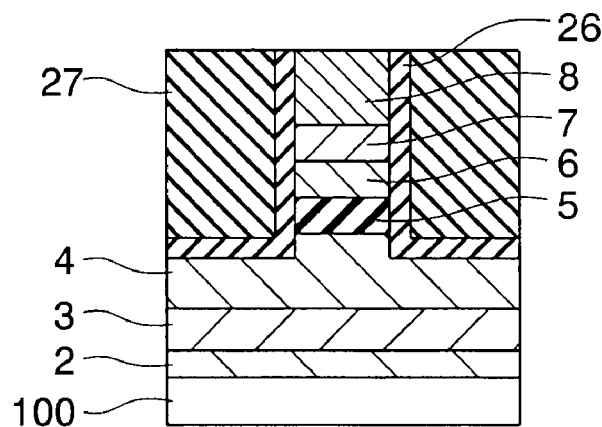
FIGS. 12A to 12C are sectional views showing manufacturing steps in the method for manufacturing a magneto-resistance effect element according to the fourth embodiment of the invention.
Figure 12B:
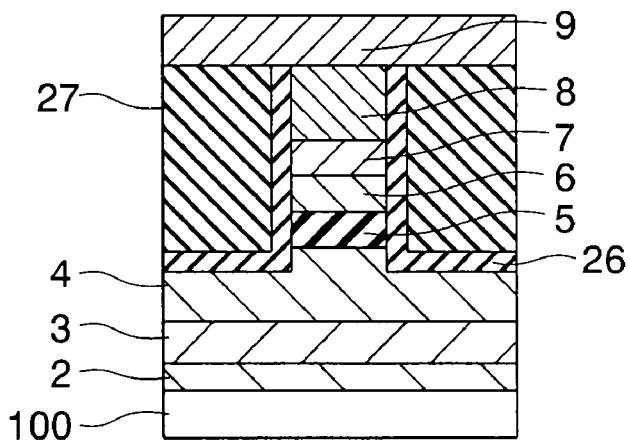
Figure 12C:
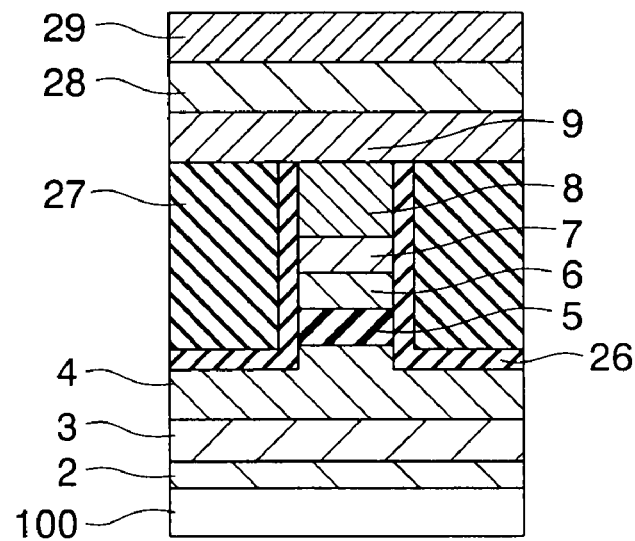

As shown in FIG. 11C, an interlayer insulating film 27 is formed by applying SOG on the whole surface of the protective film 26. Then, the interlayer insulating film 27 is etched back to expose a surface of the ferromagnetic layer 8 (see FIG. 12A). Subsequently, an anti-ferromagnetic film 9, a non-magnetic metal film 28, and an upper electrode film 29 are formed, and an upper electrode is formed according to a patterning process (see FIGS. 12B and 12C). Thereby, a magneto-resistance effect element of the embodiment is manufactured. Incidentally, orientations of magnetizations of the ferromagnetic layer 4 and the ferromagnetic layer 8 are set to be anti-parallel to each other. Accordingly, by using material for the non-magnetic layer 7 corresponding to material for the second magnetization pinned layer 8, as explained in the first embodiment, a current at a time of spin-writing can be reduced.

In the magneto-resistance effect element manufactured according to the embodiment, even if a spin-polarized current is caused to flow at a writing time, annular magnetic field generated by the writing current is very small, and magnetization is stably inverted even in a magnetic recording layer 16 with a large element size, so that writing operation can be performed reliably.

In the first to fourth embodiments, Fe—Mn (iron-manganese), Pt—Mn (platinum-manganese), Pt—Cr—Mn (platinum-chrome-manganese), Ni—Mn (nickel-manganese), Ir—Mn (iridium-manganese), NiO (nickel oxide), $Fe_2O_3$ (iron oxide) and the like can be used as material for the anti-ferromagnetic layer.

It is desirable that the magnetization pinned layer has uni-directional anisotropy and the magnetic layer has uniaxial anisotropy. It is also preferable that each of these layers has a thickness in a range of 0.1 nm to 100 nm. A film thickness of the ferromagnetic layer should be set such that super paramagnetism does not occur, and it is preferably set to 0.4 nm or more.

It is preferable that at least one selected from a group consisting of Co, Fe, Ni and alloy thereof, Co—Pt, Co—Fe—Pt, Fe—Pt, Co—Fe—Cr—Pt, and Co—Cr—Pt is used as the ferromagnetic particle isolated by dielectric (insulator) and used the magnetic recording layer.

Magnetic properties can be adjusted and/or various physical properties such as crystal property, mechanical property, or chemical property can be adjusted by adding, to the magnetic material, non-magnetic element such as Ag (silver), Cu (copper), Au (gold), Al (aluminum), Ru (ruthenium), Os (osmium), Re (rhenium), Ta (tantalum), B (boron), C (carbon), O (oxygen), N (nitrogen), Pd (palladium), Pt (platinum), Zr (zirconium), Ir (iridium), W (tungsten), Mo (molybdenum), or Nb (niobium) in the magnetic recording layer.

Each of the magneto-resistance effect elements according to the first to fourth embodiments and the modifications thereof can be used as a magnetic storing element (a magneto-resistance effect element) for a magnetic memory according to a fifth embodiment described later. In that case, in order to hold stability of magnetization of the magnetization pinned layer at a spin-writing time, a volume of each of the magnetization pinned layers 4 and 8 should be increased preferably.

Fifth Embodiment

Figure 14:
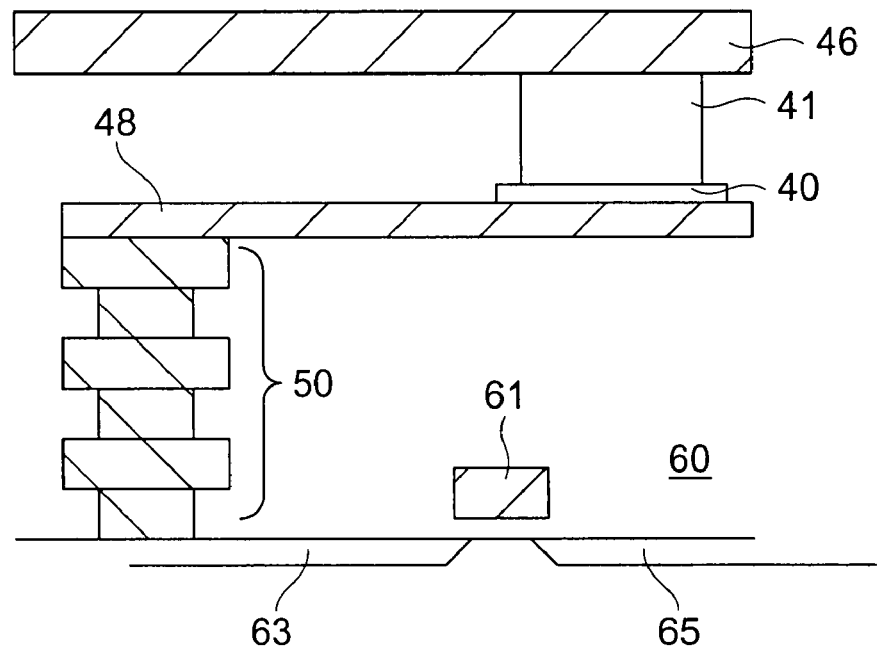
FIG. 14 is a sectional view showing a magnetic memory according to a fifth embodiment of the invention.

Next, a magnetic memory according to a fifth embodiment of the invention is shown in FIG. 14. A magnetic memory according to the embodiment has at least one memory cell, and the memory cell is provided with a magnetic storing element 40 and a selection transistor 60 for both reading and writing. The magnetic storing element 40 may be either one of the magneto-resistance effect elements according to the first to fourth embodiments and the modifications thereof, and it is arranged such that one end thereof is connected to a bit line 46 through a via 41 and the other end thereof is connected to a leading electrode 48. Incidentally, the via 41 can be omitted. The selection transistor 60 is provided with a gate electrode 61, and source and drain regions 63, 65 provided on both side of the gate electrode 61. The leading electrode 48 is connected to the source region 63 of the selection transistor 60 via a connection portion 50. The gate electrode 61 of the selection transistor 60 also serves as a work line for selecting a memory cell. Accordingly, the memory cell is provided so as to correspond to a region where the bit line 46 and the word line 61 crosses each other.

In the embodiment, writing is performed based upon determination about whether information stored in the magneto-resistance effect element is "1" or "0" made by applying a voltage to the gate electrode 61, turning ON the selection transistor 60 to cause a sense current to flow in the magneto-resistance effect element via the bit line 46 and detecting the sense current. Writing of "1" or "0" is performed by turning ON the selection transistor 60 to perform spin injection writing. Regarding behavior for reading/writing performed by spin injection, a writing current is set to be smaller than a reading current.

In the magnetic memory according to the embodiment, since either one of the magneto-resistance effect elements of the first to second embodiments and the modifications thereof is used as the magnetic storing element 40, an element area can be reduced easily and spin inversion can be performed with a small writing current.

Figure 15:
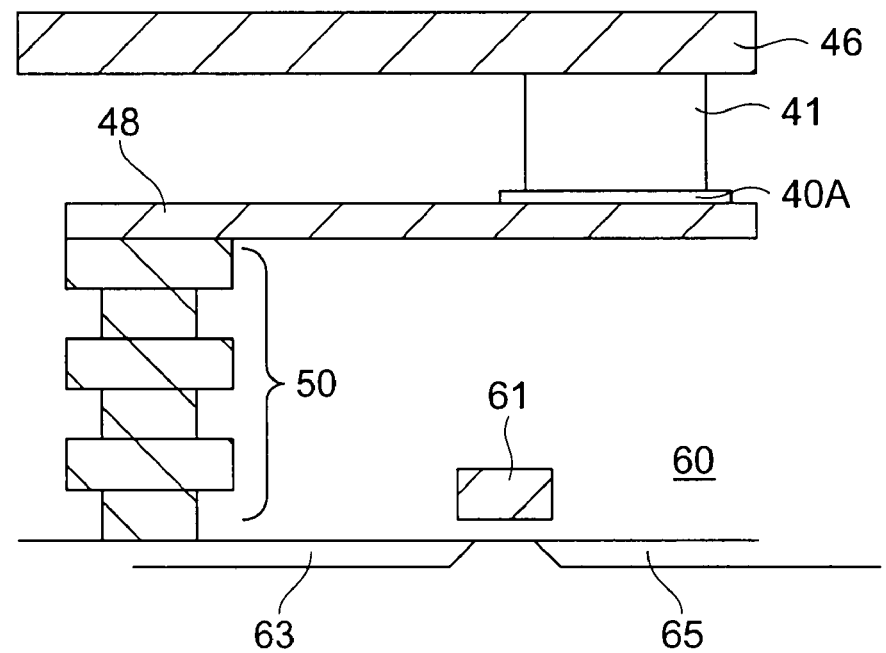
FIG. 15 is a sectional view showing a magnetic memory according to a modification of the fifth embodiment of the invention.

In the magnetic memory of the embodiment, as shown in FIG. 15, even if either one of the magneto-resistance effect element according to the third embodiment and the modifications thereof is used as a magnetic storing memory 40A, a similar advantage can be obtained. In that case, as explained in the third embodiment, even if a current spin-polarized is caused to flow at a writing time, annular magnetic field due to the writing current does not occurs so that magnetization can be stably inverted even in a magnetic recording layer with a large element size and writing behavior can be performed reliably.

The magnetic memories shown in FIGS. 14 and 15 each are further provided with a sense current control element circuit which controls a sense current to be caused to flow in the magneto-resistance effect element for reading information stored in the magneto-resistance effect element, and a driver, and sinker.

Examples of the embodiments of the invention will be explained in detail.

Example 1

Samples of a magneto-resistance effect element having the TMR structure shown in FIG. 2 were first manufactured as Example 1 of the invention.

A manufacturing procedure of the samples of the magneto-resistance effect element is as follows:

First, a base electrode 2 made of a stacked film of Ta (50 nm)/Ru (10 nm), an anti-ferromagnetic layer 3 made of PtMn (20 nm), a first magnetization pinned layer 4 made of $Co_{90}Fe_{10}$ (5 nm), a tunnel barrier layer 5 made of $AlO_X$ (1.4 nm), a magnetic recording layer 6 made of $Co_{80}Pt_{20}$ (2.0 nm), a non-magnetic layer 7 made of Rh (15 nm), a second magnetization pinned layer 8 made of $Co_{90}Fe_{10}$ (5 nm)/Ru (0.9 nm)/$Co_{90}Fe_{10}$ (3 nm), an anti-ferromagnetic layer 9 made of PtMn (20 nm), and a contact layer 10 made of Ta (150 nm) were sequentially formed on an $SiO_2$ substrate by a sputtering process. A numeral shown within a parenthesis indicates a film thickness. In the magneto-resistance effect element of the Example, the tunnel barrier layer 5, the magnetic recording layer 6, and the like were continuous films.

The tunnel barrier layer 5 with a film thickness of 1.4 nm made of $AlO_X$ was manufactured by, after forming an Al film with a film thickness of 0.6 nm, repeating natural oxidation process using pure oxygen in situ two times. Thereafter, it was found that a film thickness of an $AlO_X$ layer obtained by oxidizing Al with a film thickness of 1.2 nm was 1.4 nm, when the film thickness of the $AlO_X$ layer was examined with a section TEM (Transmission Electron Microscope).

Patterning to a tunnel junction was performed by using an EB (Electron Beam) irradiating device on only a portion defining a junction area and using a KrF stepper device on the other portions. Junction areas of the samples manufactured in the Example were $0.1 \times 0.1$ µm², $0.1 \times 0.15$ µm², $0.2 \times 0.3$ µm², and $0.25 \times 0.35$ µm².

After junction separation was performed, a protective film with a film thickness of 35 nm made of $SiO_X$ was formed, and an electrode made of Ta/Ru was patterned and formed by a milling process. Subsequently, after a contact layer was exposed by an etch back process, contact cleaning was performed, an upper electrode made of Ti (15 nm)/Al (300 nm)/Ti (15 nm) was sputtered, and patterning was conducted by RIE (reactive ion etching) process.

Thereafter, a magnetic layer was imparted with a uniaxial anisotropy by applying magnetic field to a magnetic layer in a long axis direction thereof and performing annealing for 10 hours at a temperature of 280° C.

A sample where material for the non-magnetic layer 7 was replaced with Cu was manufactured as Comparative Example.

Figure 16:
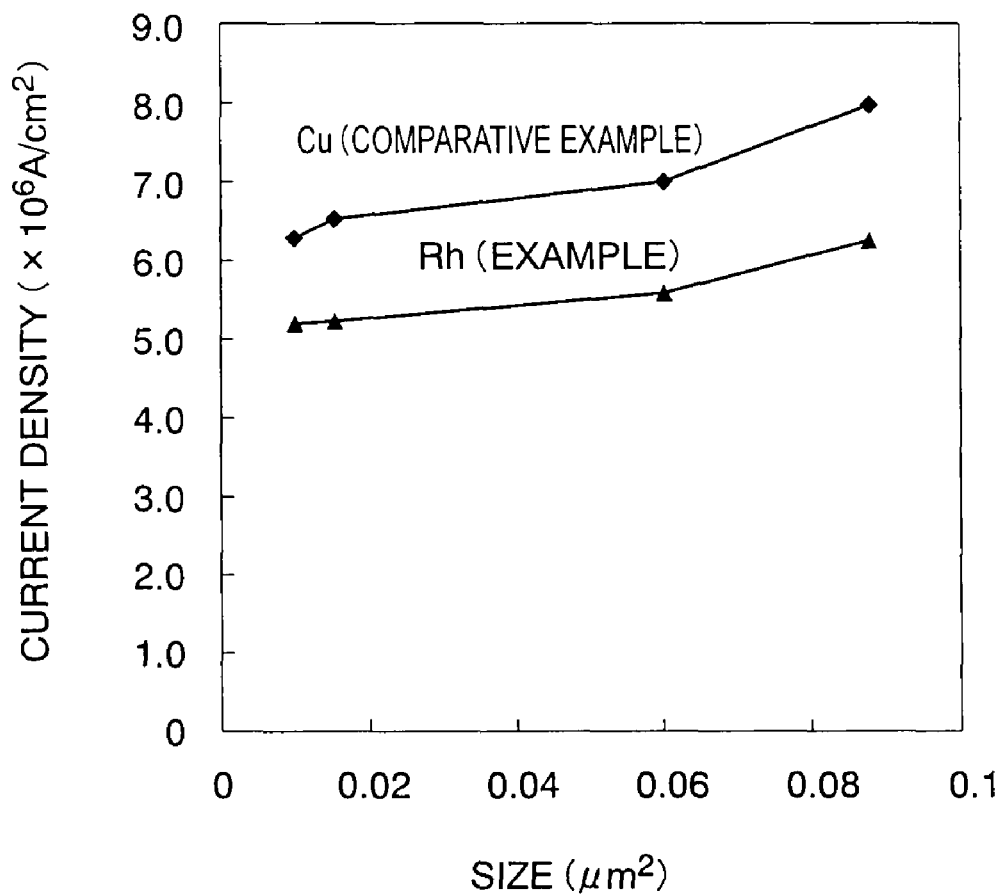
FIG. 16 is a graph showing a size dependency of a writing current density of a magneto-resistance effect element according to Example 1 of the invention.

Writing was conducted on the various samples and the sample of the Comparative Example, and current densities at which writing were enabled were measured. That is, it was found that writing at a low current density was made possible over a wide size range of a junction area of $0.1 \times 0.1$ µm² to $0.25 \times 0.35$ µm², which was different from the Comparative Example where the non-magnetic layer 7 was made of Cu (see FIG. 16).

Example 2

Next, elements having the same structure as that of Example 1 and having a combination of materials for the non-magnetic layer 7 and the second magnetization pinned layer 8 different from Example 1 were manufactured as Example 2 of the invention, and current densities required for spin writing were verified. In Example 2, orientations of magnetizations of the magnetization pinned layer 4 and the magnetization pinned layer 8 were substantially anti-parallel to each other like Example 1. A sample where material for the non-magnetic layer 7 was replaced with Cu was manufactured as a Comparative Example. Element sizes were fixed to 0.1×0.15 µm².

As a result, it was found that a low current wiring was made possible in combinations of material shown in FIG. 17.

That is, when the second magnetization pinned layer 8 is made of Co-rich ferromagnetic material, it is preferable that material for the non-magnetic layer 7 is metal including at least one selected from the group consisting of Zr, Hf, and Rh.

When the second magnetization pinned layer 8 is made of Fe-rich ferromagnetic material, it is preferable that material for the non-magnetic layer 7 is metal including at least one selected from the group consisting of Pt, Ir, and Al.

When the second magnetization pinned layer 8 is made of Ni-rich ferromagnetic material, it is preferable that material for the non-magnetic layer 7 is metal including at least one selected from the group consisting of Zr, Hf, and Au. By using one of these combinations of materials, a current at a spin writing time can be reduced.

Example 3

Next, magneto-resistance effect elements according to the second embodiment shown in FIG. 3 where magnetic moments of the first and second magnetization pinned layers were substantially parallel to each other were manufactured as Example 3 of the invention. A base electrode 2 made of a stacked film of Ta (50 nm)/Ru (10 nm), an anti-ferromagnetic layer 3 made of PtMn (20 nm), a first magnetization pinned layer 4 made of $Co_{90}Fe_{10}$ (5 nm), a tunnel barrier layer 5 made of $AlO_X$ (1.4 nm), a magnetic recording layer 6 made of $Co_{90}Fe_{10}$ (3.0 nm), a non-magnetic layer 7 with a film thickness 5 nm made of one of various materials, a second magnetization pinned layer 8 with a film thickness of 5 nm made of ferromagnetic material an anti-ferromagnetic layer 9 made of PtMn (20 nm), and a contact layer 10 made of Ta (150 nm) were sequentially formed on an $SiO_2$ substrate by a sputtering process. A numeral shown within a parenthesis indicates a film thickness. A sample where material for the non-magnetic layer 7 was replaced with Ru was manufactured as Comparative Example. Incidentally, element sizes were fixed to 0.1× 0.15 µm².

As a result, it was found that a low current wiring was made possible in combinations of materials shown in FIG. 18.

That is, when the second magnetization pinned layer 8 is made of Co-rich ferromagnetic material, it is preferable that material for the non-magnetic layer 7 is metal including at least one selected from the group consisting of Cr and Ir.

When the second magnetization pinned layer 8 is made of Fe-rich ferromagnetic material, it is preferable that material for the non-magnetic layer 7 is metal including at least one selected from the group consisting of Mn, Cr, V, and Mo.

When the second magnetization pinned layer 8 is made of Ni-rich ferromagnetic material, it is preferable that material for the non-magnetic layer 7 is metal including at least one selected from the group consisting of Cr, Rh, Ru, and Ir. By using these combinations of material, a current at a spin-writing time can be reduced.

Example 4

Next, samples with various element sizes (junction areas) provided with a base layer 2, an anti-ferromagnetic layer 3, a first magnetization pinned layer 4, a tunnel barrier layer 5, a magnetic recording layer 6, a non-magnetic layer 7, and a second magnetization layer 8 were manufactured utilizing the manufacturing method explained in the fourth embodiment, and current densities in the respective samples were measured. In respective samples, the base layer 2 was constituted of a Ta film with a film thickness of 50 nm and a Ru film with a film thickness of 10 nm, the anti-ferromagnetic layer 3 was constituted of a PtMn film with a film thickness of 15 nm, the magnetization pinned layer 4 was constituted of a $Co_{90}Fe_{10}$ film with a film thickness of 5 nm, and the tunnel barrier layer 5 was constituted of $AlO_X$ with a film thickness of 1.4 nm. As shown in FIG. 13B, the magnetic recording layer 6, the non-magnetic layer 7, and the second magnetization pinned layer 8 constitute a column-shaped stacked structure. A sample where material for the non-magnetic layer 7 was replaced with Cu was manufactured as Comparative Example. In the Example, orientations of magnetizations of the first magnetization pinned layer 4 and the second magnetization pinned layer 8 were substantially anti-parallel to each other.

Incidentally, element sizes of the respective samples and the Comparative Example were set to 0.1×0.1 µm² to 0.25× 0.35 µm², and the protective film 26 shown in FIG. 11B was made of $AlO_X$ and the column-shaped element separation film 27 was made of SOG. The magnetic recording layer was made of a $Co_{70}Fe_{10}Pt_{20}$ film with a film thickness of 3 nm. Incidentally, material for the non-magnetic layer 7 was made of Rh.

Figure 19:
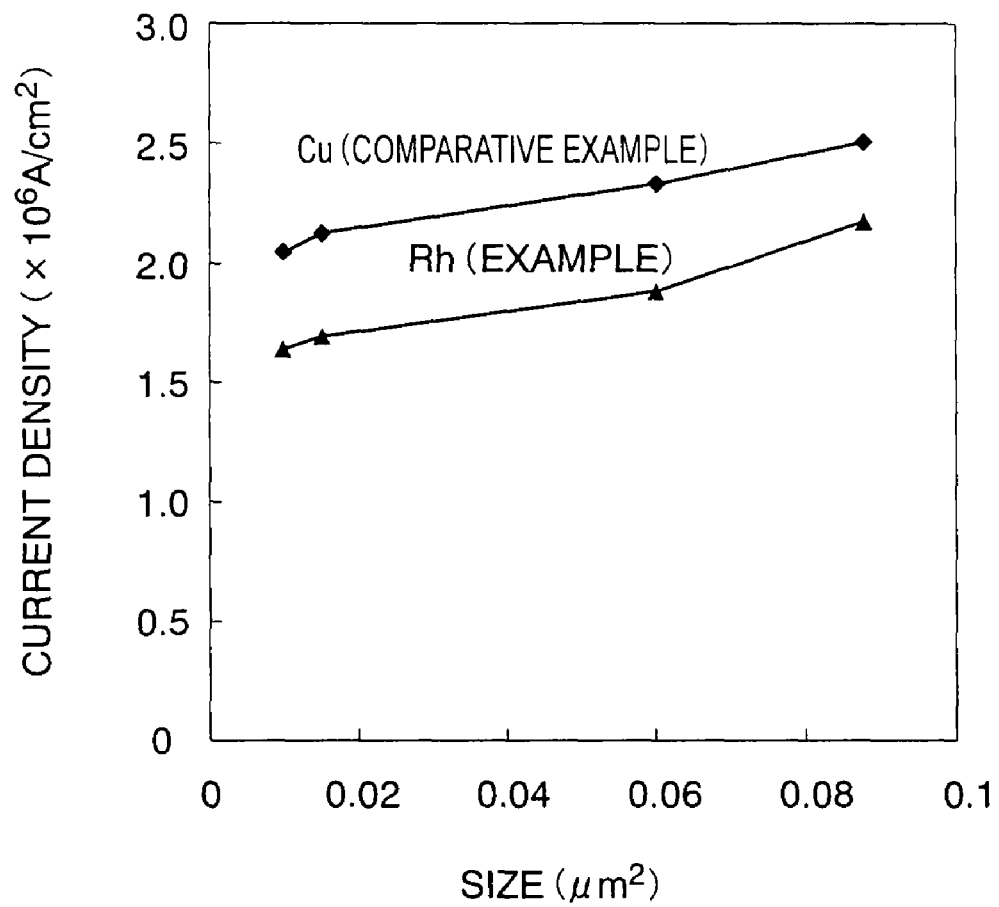
FIG. 19 is a graph showing a size dependency of a writing current density of a magneto-resistance effect element according to Example 4 of the invention.

Writing was conducted to the respective samples and Comparative Example and current densities where the writing was enabled were measured. As a result, it was found that writing at a low current density was made possible over a wide size range of 0.1×0.1 µm² to 0.25×0.35 µm², which was different from the Comparative Example where the non-magnetic layer 7 was made of Cu (see FIG. 19).

Example 5

Next, magneto-resistance effect elements having the same structure as that manufactured in Example 4 and having different combinations of materials for the non-magnetic layer 7 and the second magnetization pinned layers 8 were manufactured and current densities required for spin injection writing were measured. Incidentally, element sizes were fixed to 0.1× 0.15 µm². A sample where material for the non-magnetic layer 7 was replaced with Cu was manufactured as Comparative Example. In the Example 4 and Comparative Example, orientations of magnetizations of the first magnetization pinned layer 4 and the second magnetization pinned layer 8 were substantially anti-parallel to each other. As a result, it was found that a low current writing can be made possible utilizing combinations shown in FIG. 20.

That is, when the second magnetization pinned layer 8 is made of Co-rich ferromagnetic material, it is preferable that material for the non-magnetic layer 7 is metal including at least one selected from the group consisting of Zr, Hf, and Rh, or alloys thereof.

When the second magnetization pinned layer 8 is made of Fe-rich ferromagnetic material, it is preferable that material for the non-magnetic layer 7 is metal including at least one selected from the group consisting of Pt, Ir, and Al, or alloys thereof.

When the second magnetization pinned layer 8 is made of Ni-rich ferromagnetic material, it is preferable that material for the non-magnetic layer 7 is metal including at least one selected from the group consisting of Zr, Hf, and Au, or alloys thereof. By utilizing these combinations, a current at a spin injection current can be reduced.

Example 6

Magneto-resistance effect elements having the structure shown in FIG. 8 where orientations of magnetizations of the first and second magnetization pinned layers were substantially parallel to each other were manufactured. The magneto-resistance effect elements of the Example were manufactured in the following manner. First, a base electrode 2 constituted of a stacked film of Ta (50 nm)/Ru (10 nm), an anti-ferromagnetic layer 3 made of PtMn (20 nm), a first magnetization pinned layer 4 made of $Co_{90}Fe_{10}$ (3 nm)/Ru (0.9 nm)/$Co_{90}Fe_{10}$ (5 nm), a tunnel barrier layer 5 made of $AlO_X$ (1.4 nm), a magnetic recording layer 6 made of $Co_{80}Pt_{20}$ (2.5 nm), a non-magnetic layer 7 with a film thickness of 5 nm made of each of various materials shown in FIG. 21, a second magnetization pinned layer 8 made of ferromagnetic material (3 nm)/Ru (0.9 nm)/ferromagnetic material (5 nm), an anti-ferromagnetic material 9 made of PtMn (20 nm), and a contact layer 10 made of Ta (150 nm) were sequentially stacked on an $SiO_2$ substrate by a sputtering process. A numeral shown within a parenthesis indicates a film thickness. A manufacturing method of the elements was similar to that in Example 1. Element sizes were fixed to 0.1×0.15 µm². A sample where material for the non-magnetic layer 7 was replaced with Ru was manufactured as Comparative Example. As a result, it was found that a low current writing was made possible utilizing combinations shown in FIG. 21.

That is, when the second magnetization pinned layer 8 is made of Co-rich ferromagnetic material, it is preferable that material for the non-magnetic layer 7 is metal including at least one selected from the group consisting of Cr and Ir.

When the second magnetization pinned layer 8 is made of Fe-rich ferromagnetic material, it is preferable that material for the non-magnetic layer 7 is metal including at least one selected from the group consisting of Mn, Cr, V, and Mo.

When the second magnetization pinned layer 8 is made of Ni-rich ferromagnetic material, it is preferable that material for the non-magnetic layer 7 is metal including at least one selected from the group consisting of Rh, Ru, and Ir. By utilizing these combinations, a current at a spin injection time can be reduced.

Example 7

Magneto-resistance effect elements with the structure shown in FIG. 8 where orientations of magnetizations (magnetic moments) of the first and second magnetization pinned layers were substantially parallel to each other were manufactured as Example 7 of the invention, and dependencies of spin-inverted current densities (writing current densities) due to spin injection to materials for the non-magnetic layer 7 and the second magnetization pinned layer 8 were examined. Each magneto-resistance effect element of the Example was manufactured in the following manner. First, a base electrode 2 constituted of a stacked film of Ta (50 nm)/Ru (10 nm), an anti-ferromagnetic layer 3 made of PtMn (20 nm), a first magnetization pinned layer 4 made of $Co_{75}Fe_{25}$ (4 nm)/Ru (0.9 nm)/$(Co_{75}Fe_{25})_{80}B_{20}$ (5 nm), a tunnel barrier layer 5 made of $MgO_X$ (0.9 nm), a magnetic recording layer 6 made of $(Co_{75}Fe_{25})_{80}B_{20}$ (4 nm), a non-magnetic layer 7 with a film thickness of 5 nm made of each of various materials, a second magnetization pinned layer 8 made of ferromagnetic material (5 nm)/Ru (0.9 nm)/$Co_{75}Fe_{25}$ (4 nm), an anti-ferromagnetic material 9 made of PtMn (20 nm), and a contact layer 10 made of Ta (150 nm) were sequentially stacked on an $SiO_2$ substrate by a sputtering process. A numeral shown within a parenthesis indicates a film thickness. A manufacturing method of the elements was similar to that in Example 1. Element sizes were fixed to 0.1×0.15 µm². Comparative Example where the non-magnetic layer 7 was made of Ru and $Co_XFe_{1-X}$ (5 nm) was used as magnetic material for the magnetic layer positioned on the side of the magnetic recording layer in the second magnetization pinned layer.

As a result, the following fact was found. First, it was found that, when MgO was used as material for the tunnel barrier layer and alloy with a bcc (body-centered cubic lattice) structure or amorphous alloy was used as material for the magnetic layer, a writing current density was slightly lowered. As described below, the following matter was clarified from replacement of materials for the non-magnetic layer 7.

Figure 22:
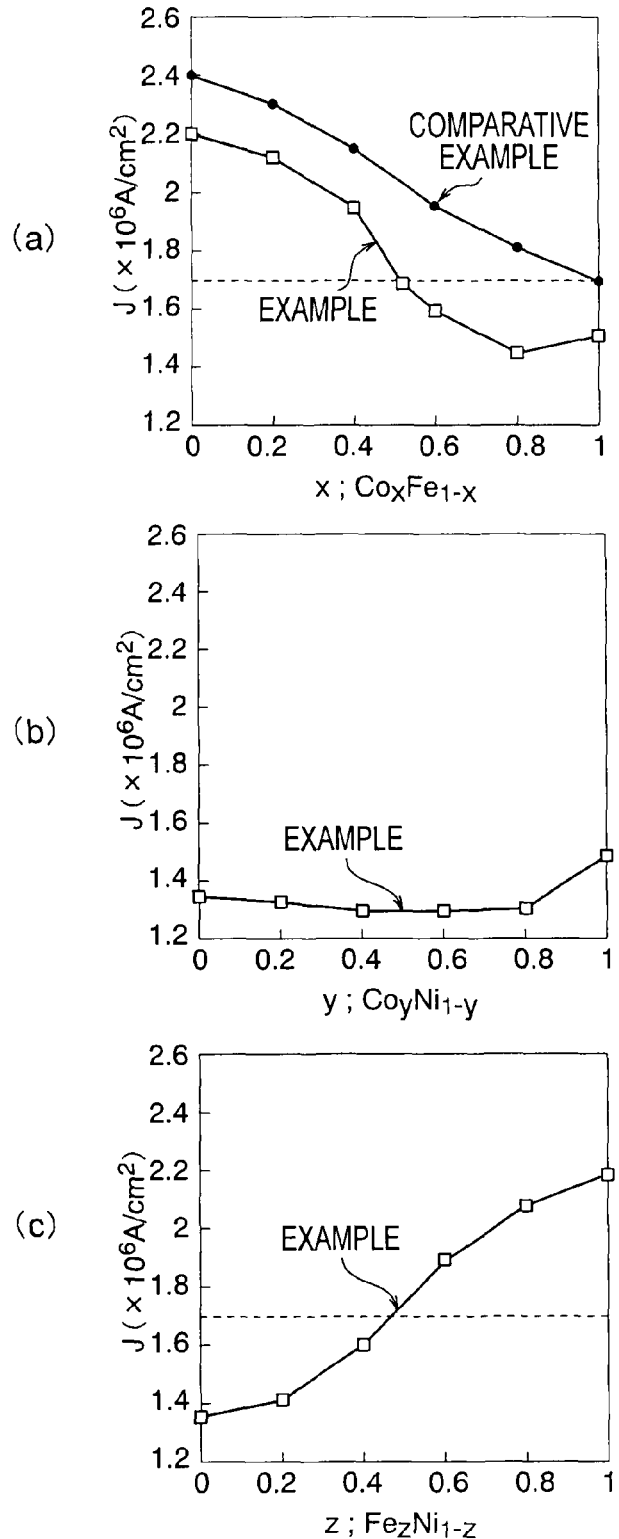
FIGS. 22(a) to 22(c) are graphs showing current densities required for spin writing to compositions of alloy constituting a second magnetization pinned layer when Cr is used as a non-magnetic layer in a magneto-resistance effect element according to Example 7 of the invention.

Inverted average current densities in Examples using Cr as material for the non-magnetic layer and using either one of Co—Fe alloy, Co—Ni alloy, and Fe—Ni alloy as magnetic material for the magnetic layer on the side of the magnetic recording layer in the second magnetization pinned layer are shown in FIGS. 22(a), 22(b), and 22(c). Comparative Example using Ru as material for the non-magnetic layer 7 and using $Co_XFe_{1-X}$ (5 nm) as material for the magnetic layer on the side of the magnetic recording layer in the second magnetization pinned layer is also shown in FIG. 22(a). As compared with the minimum value $1.7 \times 10^6$ A/cm² (corresponding to a case of x=1 (Co)) of the inverted average current density JAV obtained when material for the non-magnetic layer 7 was Ru in Comparative Example, it was clarified that the inverted average current density JAV could be further reduced when the magnetic layer on the magnetic recording layer side in the second magnetization pinned layer had one of the following compositions.

Figure 23:
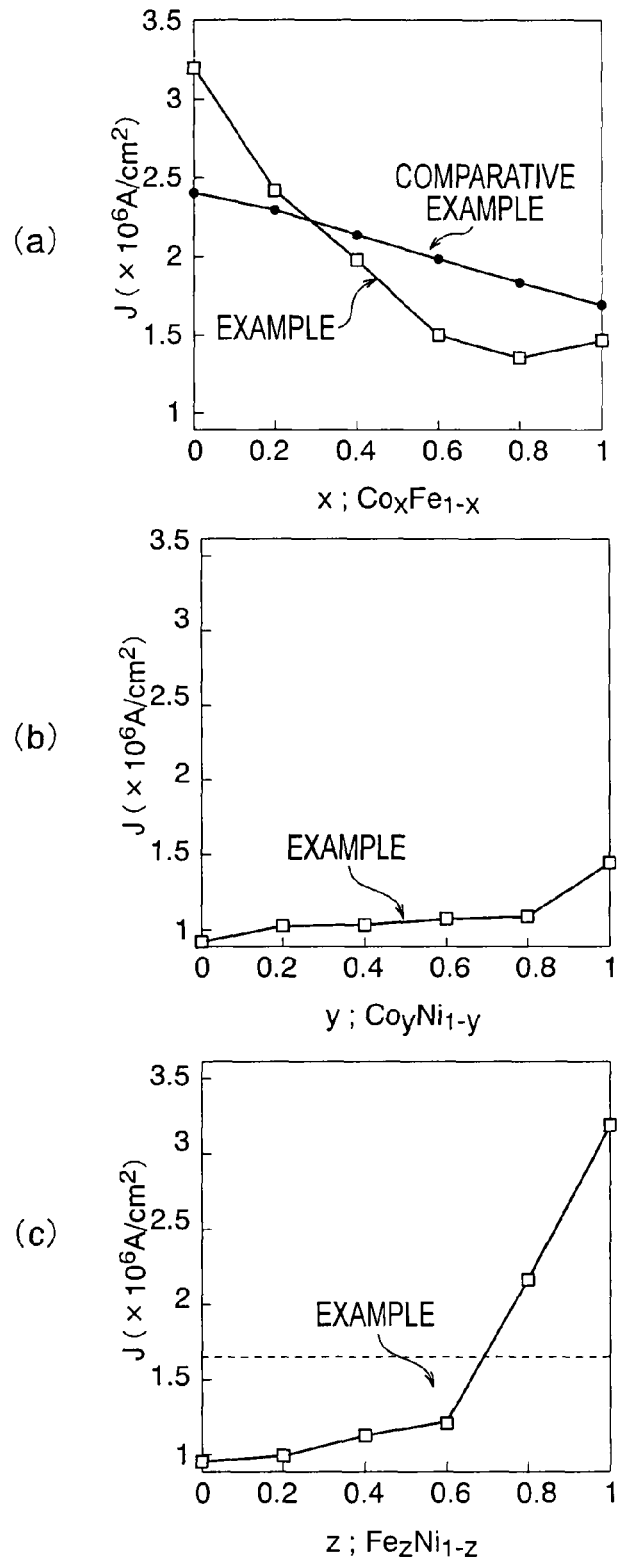
FIGS. 23(a) to 23(c) are graphs showing current densities required for spin writing to compositions of alloy constituting a second magnetization pinned layer when Ir is used as the non-magnetic layer in the magneto-resistance effect element according to Example 7 of the invention.

$0.5 \leq x \leq 1$; $Co_XFe_{1-X}$
$0 \leq y \leq 1$; $Co_YNi_{1-Y}$
$0 \leq z \leq 0.475$; $Fe_ZNi_{1-Z}$ Next, Examples using Ir as material for the non-magnetic layer and using either one of Co—Fe alloy, Co—Ni alloy, and Fe—Ni alloy as the magnetic material on the side of the magnetic recording layer in the second magnetization pinned layer are shown in FIGS. 23(a), 23(b), and 23(c). Comparative Example using Ru as material for the non-magnetic layer 7 and using $Co_XFe_{1-X}$ (5 nm) as material for the magnetic layer on the side of the magnetic recording layer in the second magnetization pinned layer is also shown in FIG. 23(a). As compared with the minimum value $1.7 \times 10^6$ A/cm² of the inverted average current density JAV obtained when material for the non-magnetic layer 7 was Ru in Comparative Example, it was clarified that the inverted average current density JAV could be further reduced when the magnetic layer on the magnetic recording layer side in the second magnetization pinned layer had one of the following compositions.

Figure 24:
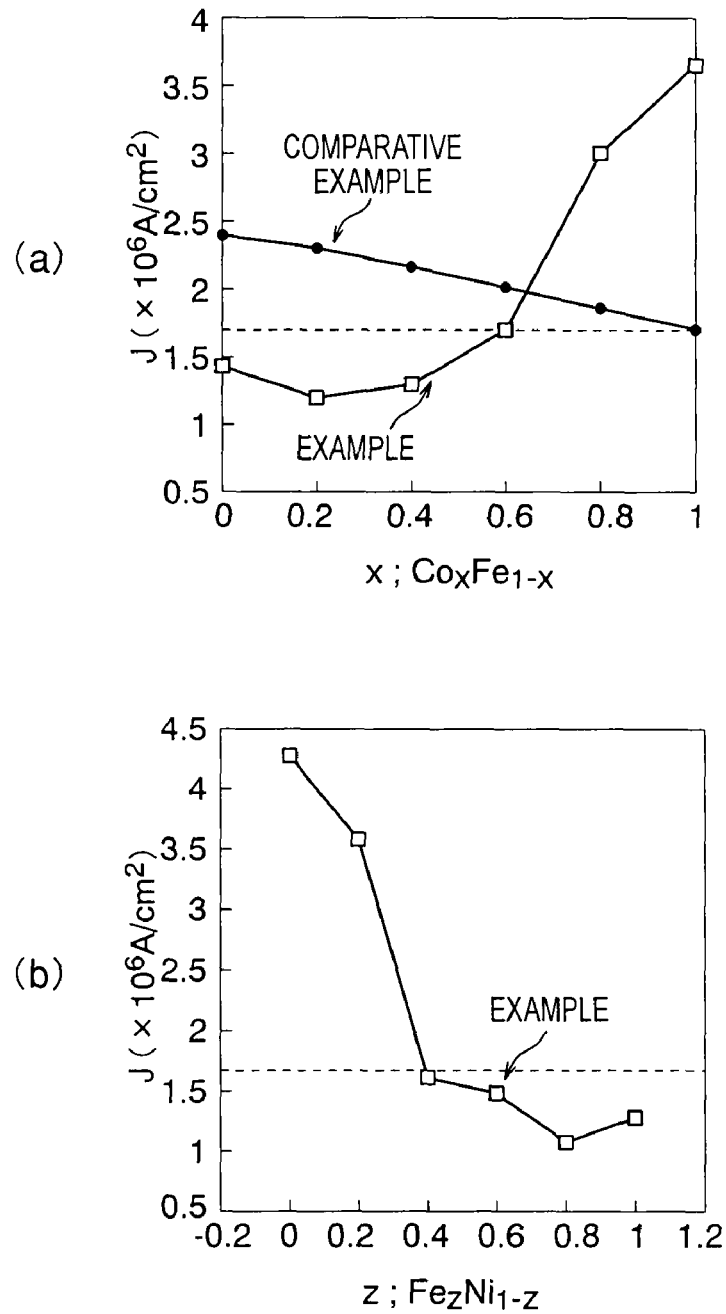
FIGS. 24(a) and 24(b) are graphs showing current densities required for spin writing to compositions of alloy constituting a second magnetization pinned layer when Mn is used as the non-magnetic layer in the magneto-resistance effect element according to Example 7 of the invention.

$0.3 \leq x \leq 1$; $Co_XFe_{1-X}$
$0 \leq y \leq 1$; $Co_YNi_{1-Y}$
$0 \leq z \leq 0.7$; $Fe_ZNi_{1-Z}$ Next, Examples using Mn for material for the non-magnetic layer and using either one of Co—Fe alloy and Fe—Ni alloy as the magnetic material on the side of the magnetic recording layer in the second magnetization pinned layer were shown in FIGS. 24(a) are 24(b). Comparative Example using Ru as material for the non-magnetic layer 7 and using $Co_XFe_{1-X}$ (5 nm) as material for the magnetic layer on the side of the magnetic recording layer in the second magnetization pinned layer is shown in FIG. 24(a). As compared with the minimum value $1.7 \times 10^6$ A/cm² of an inverted average current density JAV obtained when material for the non-magnetic layer 7 was Ru in Comparative Example, it was clarified that the inverted average current density JAV could be further reduced when the magnetic layer on the magnetic recording layer side in the second magnetization pinned layer had one of the following compositions.

$0 \leq x \leq 0.64$; $Co_xFe_{1-x}$
$0.4 \leq x \leq 1.0$; $Fe_zNi_{1-z}$

Figure 25:
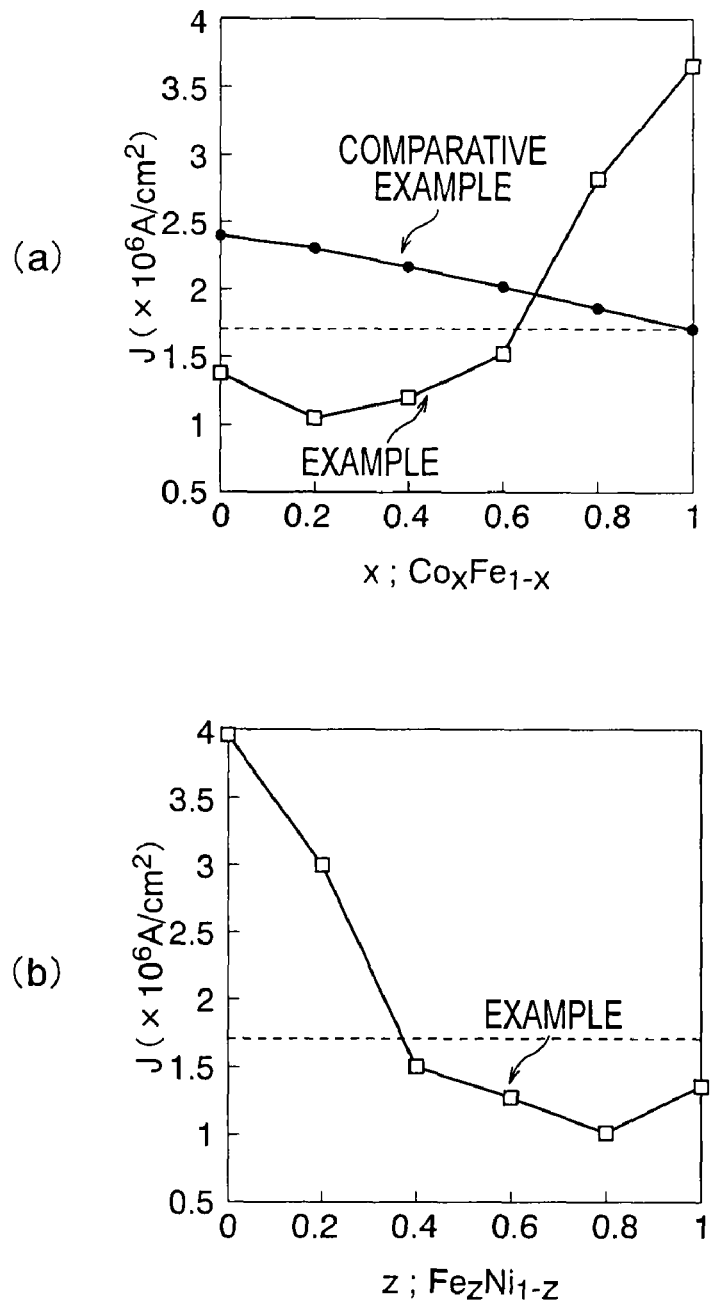
FIGS. 25(a) to 25(b) are graphs showing current densities required for spin writing to compositions of alloy constituting a second magnetization pinned layer when V is used as the non-magnetic layer in the magneto-resistance effect element according to Example 7 of the invention.

Next, Examples using V as material for the non-magnetic layer and using either one of Co—Fe alloy and Fe—Ni alloy as the magnetic material on the side of the magnetic recording layer in the second magnetization pinned layer are shown in FIGS. 25(a) and 25(b). Comparative Example using Ru as material for the non-magnetic layer 7 and using $Co_xFe_{1-x}$ (5 nm) as material for the magnetic layer on the side of the magnetic recording layer in the second magnetization pinned layer is shown in FIG. 25(a). From comparison with the minimum value $1.7 \times 10^6$ A/cm² of an inverted average current density JAV obtained when material for the non-magnetic layer 7 was Ru in Comparative Example, it was clarified that the inverted average current density JAV could be further reduced when the magnetic layer on the magnetic recording layer side in the second magnetization pinned layer had one of the following compositions.

$0 \leq x \leq 0.64$; $Co_xFe_{1-x}$
$0.375 \leq z \leq 1.0$; $Fe_zNi_{1-z}$

Figure 26:
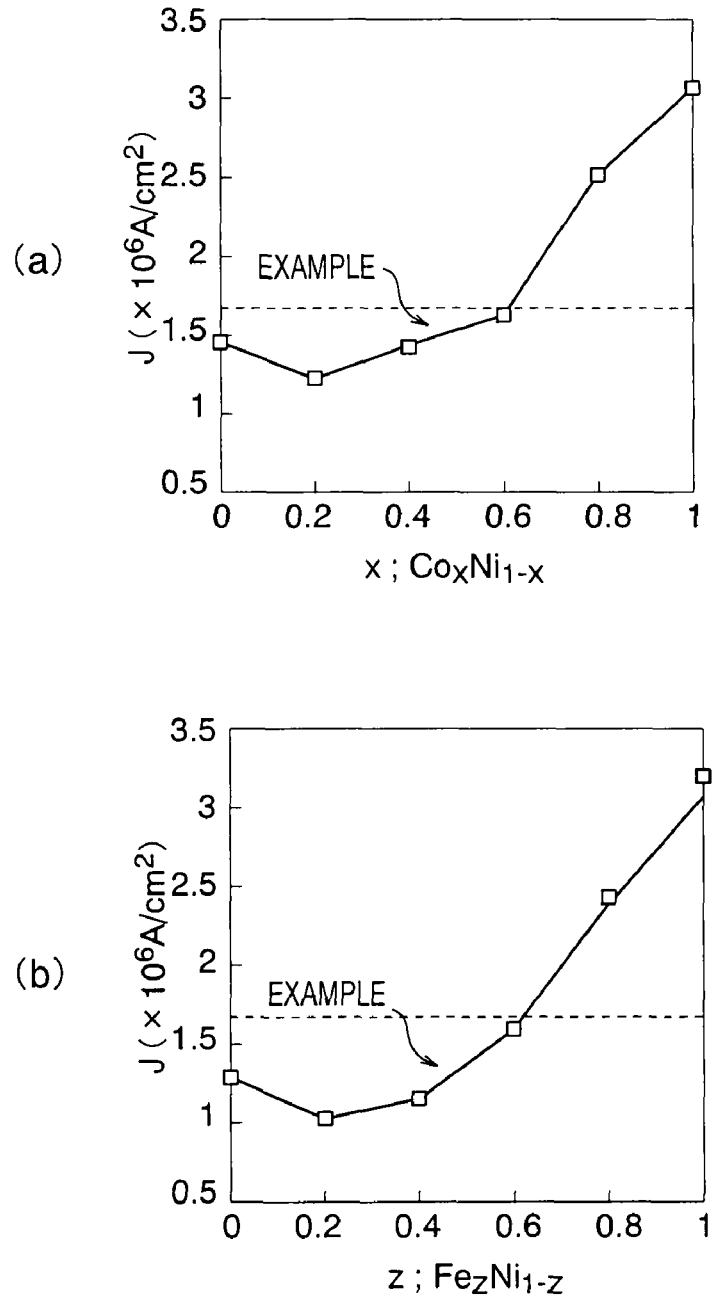
FIGS. 26(a) to 26(b) are graphs showing current densities required for spin writing to compositions of alloy constituting a second magnetization pinned layer when Rh is used as the non-magnetic layer in the magneto-resistance effect element according to Example 7 of the invention.

Next, Examples using Rh as material for the non-magnetic layer and using either one of Co—Ni alloy and Fe—Ni alloy as the magnetic material on the side of the magnetic recording layer in the second magnetization pinned layer are shown in FIGS. 26(a) and 26(b). Comparative Example using Ru as material for the non-magnetic layer 7 and using $Co_xFe_{1-x}$ (5 nm) as material for the magnetic layer on the side of the magnetic recording layer in the second magnetization pinned layer is shown in FIG. 26(a). From compared with the minimum value $1.7 \times 10^6$ A/cm² of the inverted average current density JAV obtained when material for the non-magnetic layer 7 was Ru in Comparative Example, it was clarified that the inverted average current density JAV could be further reduced when the magnetic layer on the magnetic recording layer side in the second magnetization pinned layer had one of the following compositions.

$0 \leq x \leq 0.62$; $Co_xNi_{1-x}$
$0 \leq z \leq 0.63$; $Fe_zNi_{1-z}$

Figure 27:
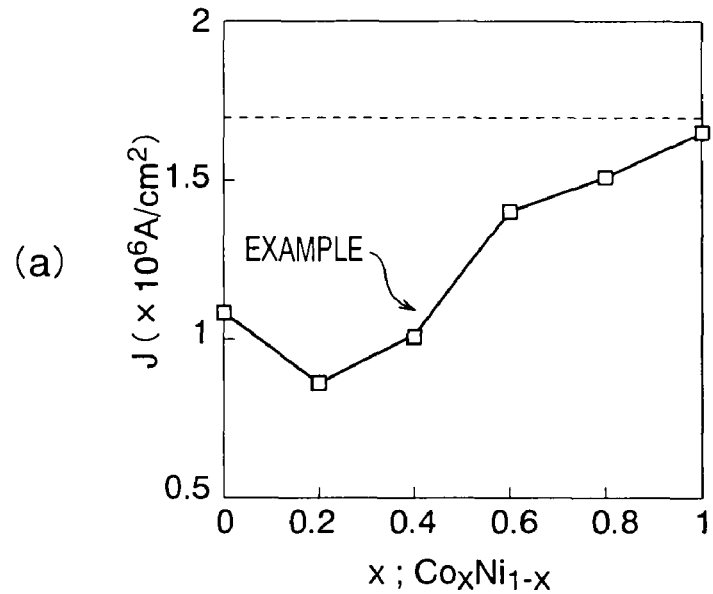
FIGS. 27(a) to 27(b) are graphs showing current densities required for spin writing to compositions of alloy constituting a second magnetization pinned layer when Ru is used as the non-magnetic layer in the magneto-resistance effect element according to Example 7 of the invention.
Figure 27:
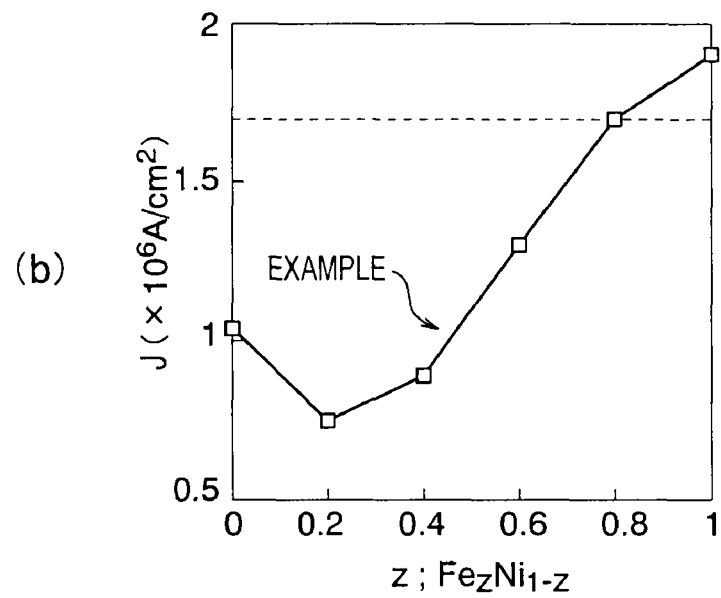

Next, Examples using Ru as material for the non-magnetic layer and using either one of Co—Ni alloy and Fe—Ni alloy as the magnetic material on the side of the magnetic recording layer in the second magnetization pinned layer are shown in FIGS. 27(a) and 27(b). Comparative Example using Ru as material for the non-magnetic layer 7 and using $Co_xFe_{1-x}$ (5 nm) as material for the magnetic layer on the side of the magnetic recording layer in the second magnetization pinned layer is shown in FIG. 27(a). As compared with the minimum value $1.7 \times 10^6$ A/cm² of the inverted average current density JAV obtained when material for the non-magnetic layer 7 was Ru in Comparative Example, it was clarified that the inverted average current density JAV could be further reduced when the magnetic layer on the magnetic recording layer side in the second magnetization pinned layer had one of the following compositions.

$0 \leq x \leq 1.0$; $Co_xNi_{1-x}$
$0 \leq z \leq 0.8$; $Fe_zNi_{1-z}$

Example 8

Figure 28:
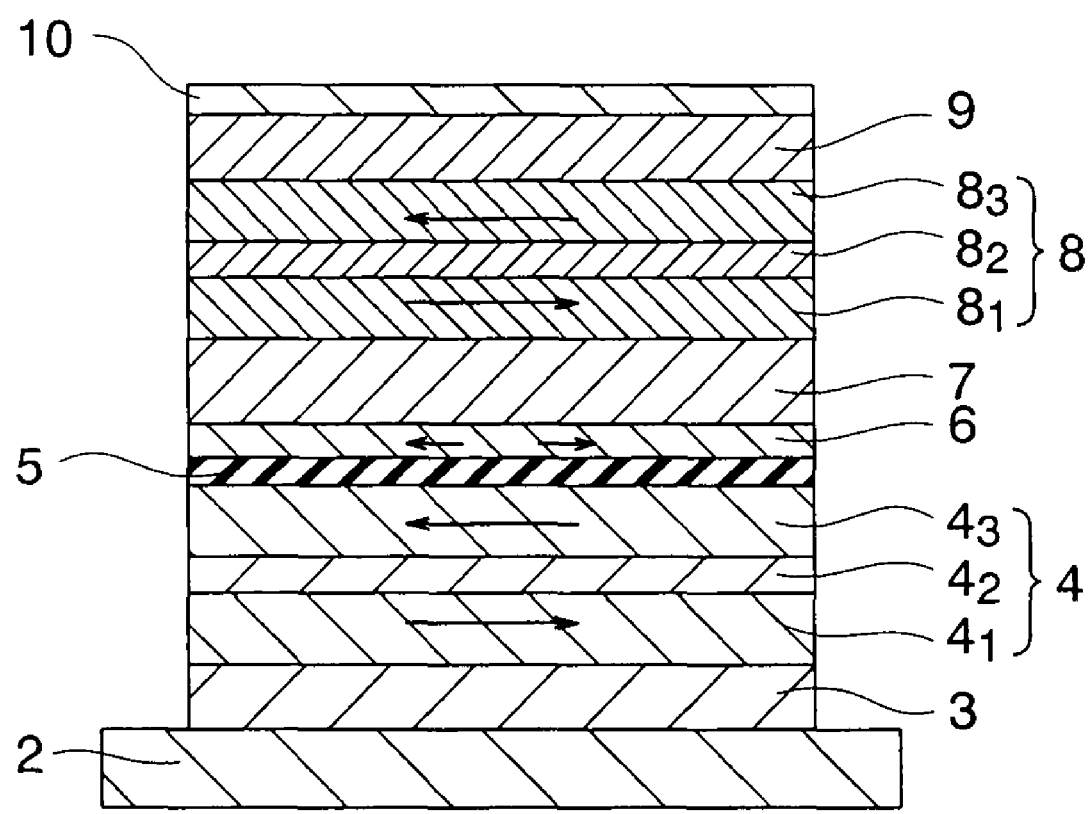
FIG. 28 is a sectional view showing a magneto-resistance effect element according to Example 8 of the invention.

Next, magneto-resistance effect elements having a structure shown in FIG. 28 where magnetic moments were substantially anti-parallel to each other were manufactured as Example 8 of the invention, and dependencies of a spin injection inversion current density to material for the non-magnetic layer 7 serving as a reflecting film and material for the second magnetization pinned layer 8 were examined. In this Example, the magnetic recording layer 6 was a continuous film. A base electrode 2 constituted of a stacked film of Ta (50 nm)/Ru (10 nm), an anti-ferromagnetic layer 3 made of PtMn (20 nm), a first magnetization pinned layer 4 made of $Co_{75}Fe_{25}$ (4 nm)/Rh (0.9 nm)/$(Co_{75}Fe_{25})_{80}B_{20}$ (5 nm), a tunnel barrier layer 5 made of $MgO_X$ (0.9 nm), a magnetic recording layer 6 made of $(Co_{75}Fe_{25})_{80}B_{20}$ (4 nm), a non-magnetic layer (5 nm) 7 made of each of various materials, a second magnetization pinned layer 8 made of a magnetic layer (5 nm)/Ru (0.9 nm)/$Co_{75}Fe_{25}$ (4 nm), an anti-ferromagnetic material 9 made of PtMn (20 nm), and a contact layer 10 made of Ta (150 nm) were sequentially stacked on an $SiO_2$ substrate by a sputtering process. A numeral shown within a parenthesis indicates a film thickness. A manufacturing method of the elements was similar to that in Example 1. Element sizes were fixed to $0.1 \times 0.15$ μm². A magneto-resistance effect element where Cu was used for material for the non-magnetic layer in the reflecting film and $Co_xFe_{1-x}$ (5 nm) was used as material for the magnetic layer in the second magnetization pinned layer was also manufactured as Comparative Example.

As a result, the following fact was found. First, it was found that, when MgO was used as material for the tunnel barrier layer and alloy with a bcc (body-centered cubic lattice) structure or amorphous alloy was used as material for the magnetic layer, a writing current density was slightly lowered. As described below, the following matter was clarified from replacement of materials for the reflecting film.

Figure 29:
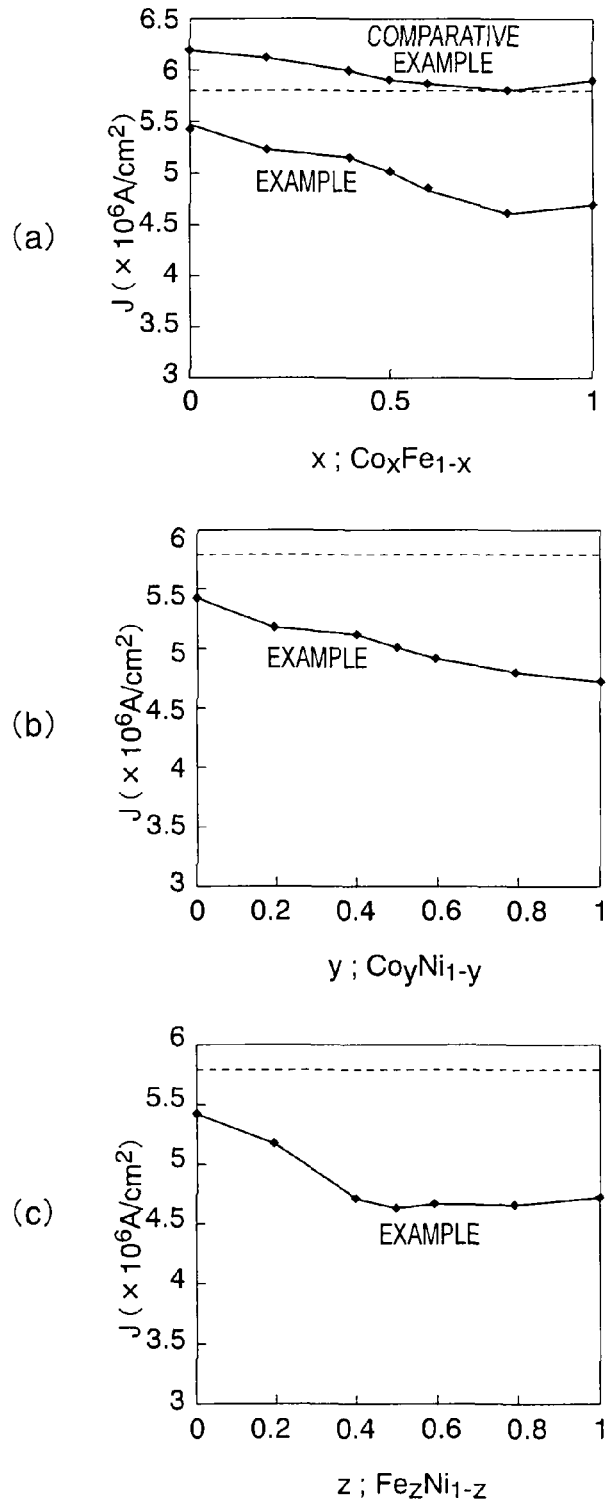
FIGS. 29(a) to 29(c) are graphs showing current densities required for spin writing to compositions of alloy constituting a second magnetization pinned layer when Ag is used as a non-magnetic layer in a magneto-resistance effect element according to Example 8 of the invention.

Inverted average current densities in Examples using Ag as material for the non-magnetic layer 7 and using either one of Co—Fe alloy, Co—Ni alloy, and Fe—Ni alloy as magnetic material for the magnetic layer on the side of the magnetic recording layer 6 in the second magnetization pinned layer 8 are shown in FIGS. 29(a), 29(b), and 29(c). Comparative Example using Cu as material for the non-magnetic layer 7 and using $Co_xFe_{1-x}$ (5 nm) as material for the magnetic layer in the second magnetization pinned layer is also shown in FIG. 29(a). As compared with the minimum value $6.0 \times 10^6$ A/cm² of the inverted average current density JAV obtained when material for the non-magnetic layer 7 was Cu in Comparative Example, it was clarified that the inverted average current density JAV could be further reduced when the magnetic layer on the side of the magnetic recording layer 6 in the second magnetization pinned layer 8 had one of the following compositions.

$0 \leq x \leq 1$; $Co_xFe_{1-x}$
$0 \leq y \leq 1$; $Co_yNi_{1-y}$
$0 \leq z \leq 1$; $Fe_zNi_{1-z}$ Incidentally, graphs shown with broken lines in FIGS. 29(a), 29(b), and 29(c) indicate the minimum values of the inverted average current densities in Comparative Example.

Figure 30:
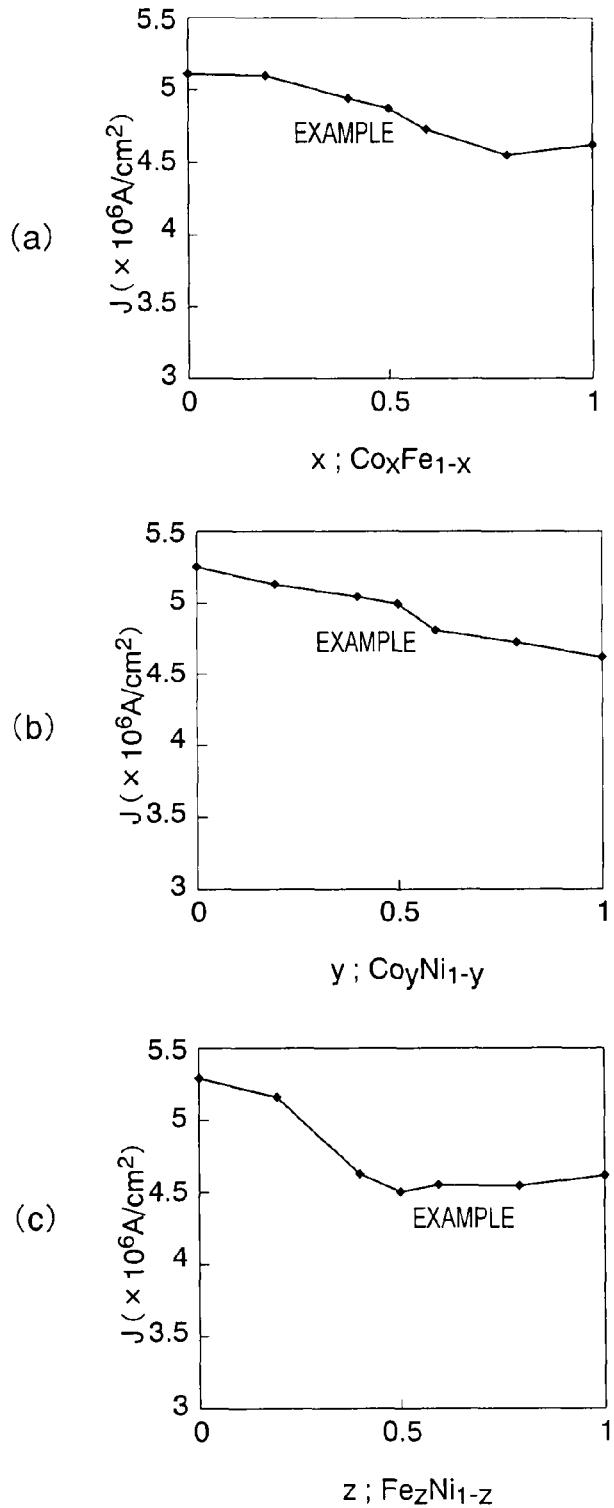
FIGS. 30(a) to 30(c) are graphs showing current densities required for spin writing to compositions of alloy constituting a second magnetization pinned layer when Au is used as a non-magnetic layer in the magneto-resistance effect element according to Example 8 of the invention.

Similarly, inverted average current densities in Examples using Au as material for the non-magnetic layer 7 and using either one of Co—Fe alloy, Co—Ni alloy, and Fe—Ni alloy as magnetic material for the magnetic layer on the side of the magnetic recording layer 6 in the second magnetization pinned layer 8 are shown in FIGS. 30(a), 30(b), and 30(c). It was clarified from Comparative Example using Cu as material for the non-magnetic layer 7 and using $Co_xFe_{1-x}$ (5 nm) as material for the magnetic layer in the second magnetization pinned layer that, as compared with the minimum value $6.0 \times 10^6$ A/cm² of the inverted average current density JAV obtained when material for the non-magnetic layer 7 was Cu in the Comparative Example, the inverted average current density JAV could be further reduced when the magnetic layer on the side of the magnetic recording layer 6 in the second magnetization pinned layer 8 had one of the following compositions.

Figure 31:
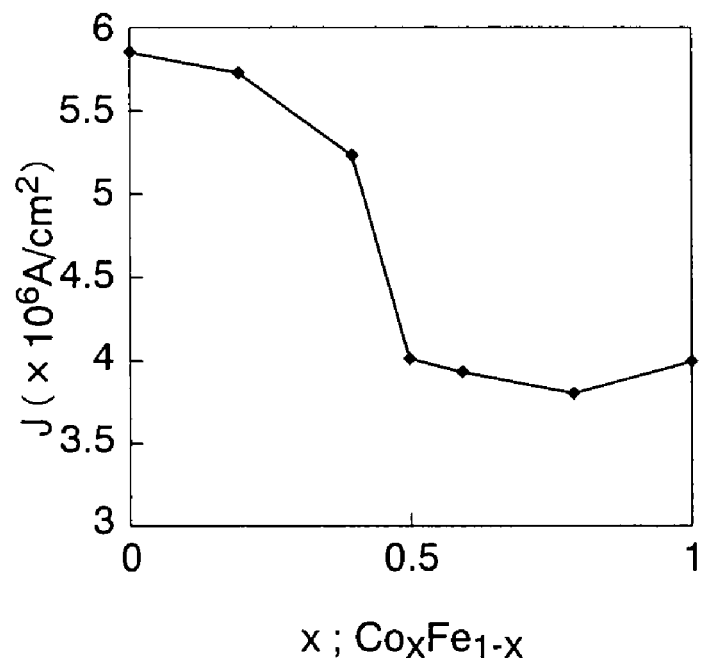
FIG. 31 is a graph showing a current density for spin writing to composition of alloy constituting a second magnetization pinned layer when Rh is used as the non-magnetic layer in a magneto-resistance effect element according to Example 8 of the invention.

$0 \leq x \leq 1$; $Co_xFe_{1-X}$
$0 \leq y \leq 1$; $Co_yNi_{1-y}$
$0 \leq z \leq 1$; $Fe_zNi_{1-Z}$ Similarly, an inverted average current density in Example using Au as material for the non-magnetic layer 7 and using Co—Fe alloy as magnetic material for the magnetic layer on the side of the magnetic recording layer 6 in the second magnetization pinned layer 8 is shown in FIG. 31. It was clarified from Comparative Example using Cu as material for the non-magnetic layer 7 and using $Co_xFe_{1-X}$ (5 nm) as material for the magnetic layer in the second magnetization pinned layer that, as compared with the minimum value JAV $6.0 \times 10^6$ A/cm² of the inverted average current density obtained when material for the non-magnetic layer 7 was Cu in the Comparative Example, the inverted average current density JAV could be further reduced when the magnetic layer on the side of the magnetic recording layer 6 in the second magnetization pinned layer 8 had the following composition.

$0 \leq x \leq 1$; $Co_xFe_{1-X}$

Example 9

Figure 32:
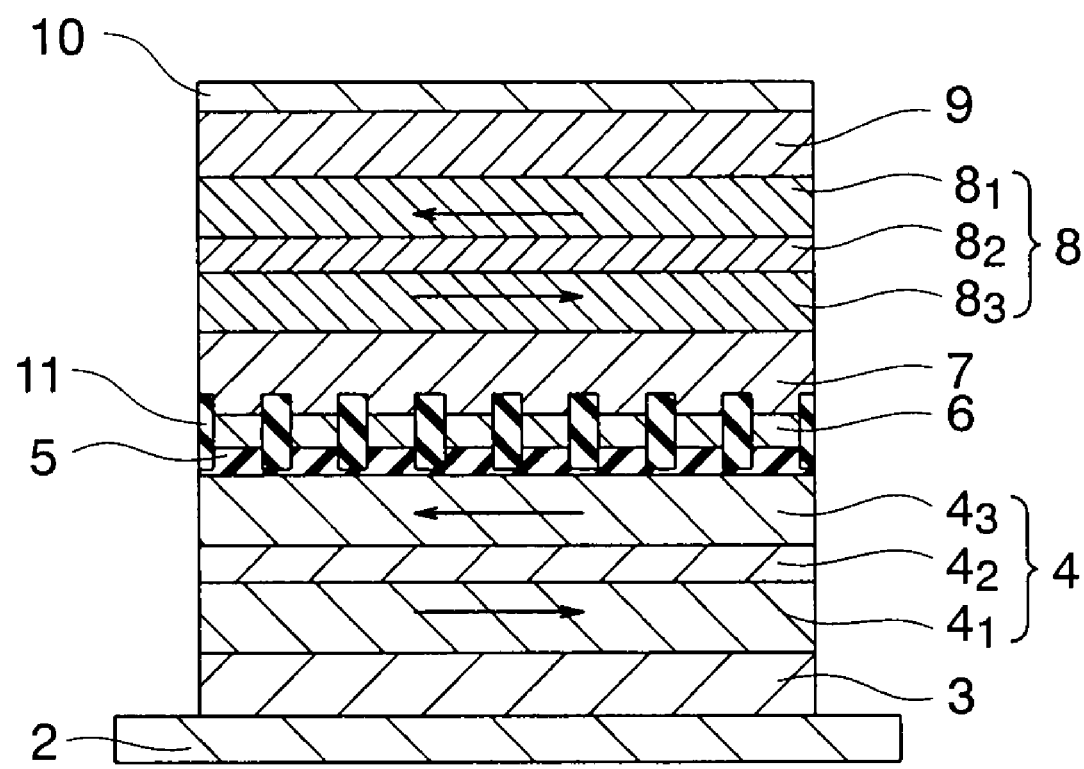
FIG. 32 is a sectional view showing a magneto-resistance effect element according to Example 9 of the invention.

Next, magneto-resistance effect elements having a structure shown in FIG. 32 where magnetic moments of the first and second magnetization pinned layers were substantially anti-parallel to each other were manufactured as Example 9 of the invention, and dependencies of a spin injection inversion current density to material for the non-magnetic layer 7 serving as a reflecting film and material for the second magnetization pinned layer 8 were examined. In this Example, the magnetic recording layer 6 had a discrete configuration. A base electrode 2 constituted of a stacked film of Ta (50 nm)/Ru (10 nm), an anti-ferromagnetic layer 3 made of PtMn (20 nm), a first magnetization pinned layer 4 made of $Co_{75}Fe_{25}$ (4 nm)/Rh (0.9 nm)/$(Co_{75}Fe_{25})_{80}B_{20}$ (5 nm), a tunnel barrier layer 5 made of $MgO_X$ (0.9 nm), a magnetic recording layer 6 made of $(Co_{75}Fe_{25})_{80}B_{20}$ (4 nm), a non-magnetic layer 7 made of each of various materials (5 nm), a second magnetization pinned layer 8 made of a magnetic layer (5 nm)/Ru (0.9 nm)/$Co_{75}Fe_{25}$ (4 nm), an anti-ferromagnetic material 9 made of PtMn (20 nm), and a contact layer 10 made of Ta (150 nm) were sequentially stacked on an $SiO_2$ substrate by a sputtering process. A numeral shown within a parenthesis indicates a film thickness. A manufacturing method of the elements was similar to that in Example 1. Element sizes were fixed to $0.1 \times 0.15$ μm². A magneto-resistance effect element using Cu as material for the non-magnetic layer in the reflecting film and using $Co_xFe_{1-X}$ (5 nm) as material for the magnetic layer in the second magnetization pinned layer was manufactured as Comparative Example.

As a result, the following fact was found. First, it was found that, when MgO was used as material for the tunnel barrier layer and alloy with a bcc (body-centered cubic lattice) structure or amorphous alloy was used as material for the magnetic layer, a writing current density was slightly lowered. As described below, the following matter was clarified from replacement of materials for the reflecting film.

Figure 33:
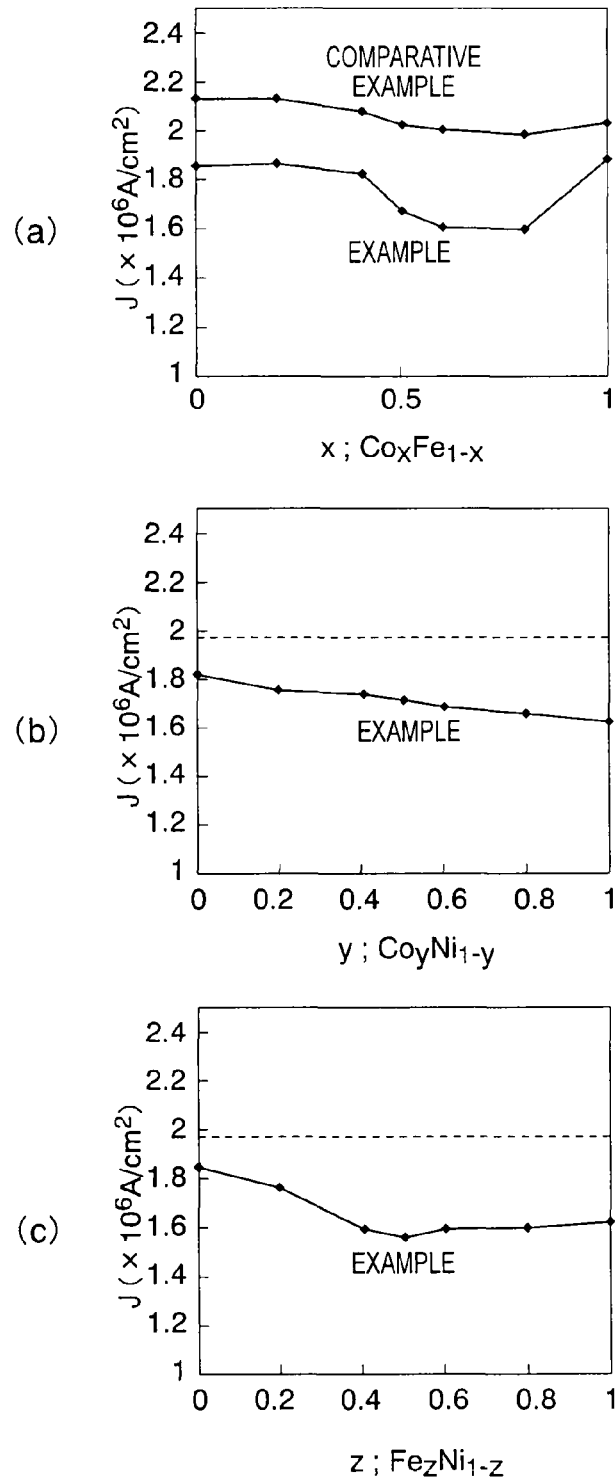
FIGS. 33(a) to 33(c) are graphs showing current densities required for spin writing to compositions of alloy constituting a second magnetization pinned layer when Ag is used as a non-magnetic layer in the magneto-resistance effect element according to Example 9 of the invention.

Inverted average current densities in Examples using Ag as material for the non-magnetic layer 7 and using either one of Co—Fe alloy, Co—Ni alloy, and Fe—Ni alloy as magnetic material for the magnetic layer on the side of the magnetic recording layer 6 in the second magnetization pinned layer 8 are shown in FIGS. 33(a), 33(b), and 33(c). Comparative Example using Cu as material for the non-magnetic layer 7 and using $Co_xFe_{1-X}$ (5 nm) as material for the magnetic layer in the second magnetization pinned layer is also shown in FIG. 33(a). From comparison with the minimum value $1.98 \times 10^6$ A/cm² of the inverted average current density JAV obtained when material for the non-magnetic layer 7 was Cu in Comparative Example, it was clarified that the inverted average current density JAV could be further reduced when the magnetic layer on the side of the magnetic recording layer 6 in the second magnetization pinned layer 8 had one of the following compositions.

$0 \leq x \leq 1$; $Co_xFe_{1-X}$
$0 \leq y \leq 1$; $Co_yNi_{1-y}$
$0 \leq z \leq 1$; $Fe_zNi_{1-Z}$ Incidentally, graphs shown with broken lines in FIGS. 33(b) and 33(c) indicate the minimum value $1.98 \times 10^6$ A/cm² of the inverted average current densities in Comparative Example.

Figure 34:
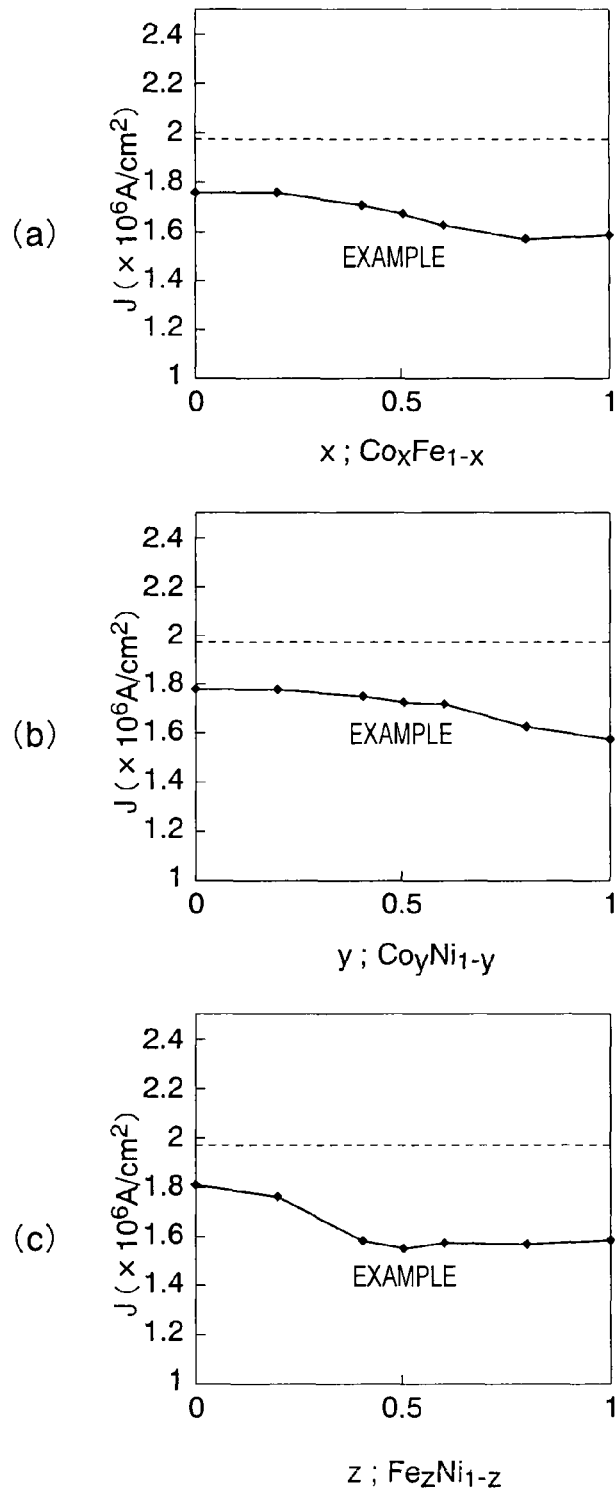
FIGS. 34(a) to 34(c) are graphs showing current densities required for spin writing to compositions of alloy constituting a second magnetization pinned layer when Au is used as a non-magnetic layer in the magneto-resistance effect element according to Example 9 of the invention.

Similarly, inverted average current densities in Examples using Au as material for the non-magnetic layer 7 and using either one of Co—Fe alloy, Co—Ni alloy, and Fe—Ni alloy as magnetic material for the magnetic layer on the side of the magnetic recording layer 6 in the second magnetization pinned layer 8 are shown in FIGS. 34(a), 34(b), and 34(c). It was clarified from Comparative Example using Cu as material for the non-magnetic layer 7 and using $Co_xFe_{1-X}$ (5 nm) as material for the magnetic layer in the second magnetization pinned layer that, as compared with the minimum value $1.98 \times 10^6$ A/cm² of the inverted average current density JAV obtained when material for the non-magnetic layer 7 was Cu in Comparative Example, the inverted average current density JAV could be further reduced when the magnetic layer on the side of the magnetic recording layer 6 in the second magnetization pinned layer 8 had one of the following compositions.

Figure 35:
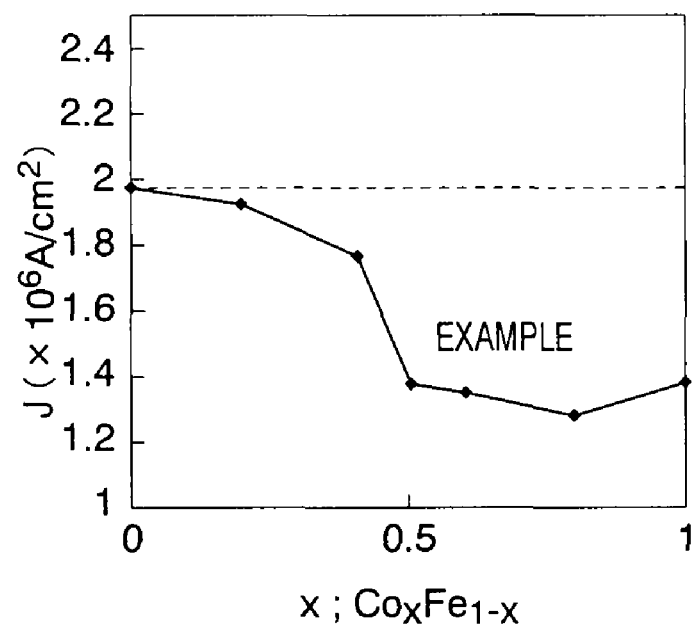
FIG. 35 is a graph showing a current density for spin writing to composition of alloy constituting a second magnetization pinned layer when Rh is used as the non-magnetic layer in the magneto-resistance effect element according to Example 9 of the invention.

$0 \leq x \leq 1$; $Co_xFe_{1-X}$
$0 \leq y \leq 1$; $Co_yNi_{1-y}$
$0 \leq z \leq 1$; $Fe_zNi_{1-Z}$ Similarly, an inverted average current density in Example using Au as material for the non-magnetic layer 7 and using Co—Fe alloy as magnetic material for the magnetic layer on the side of the magnetic recording layer 6 in the second magnetization pinned layer 8 is shown in FIG. 35. It was clarified from Comparative Example where Cu was used as material for the non-magnetic layer 7 and $Co_xFe_{1-X}$ (5 nm) was used as material for the magnetic layer in the second magnetization pinned layer that, as compared with the minimum value JAV $1.98 \times 10^6$ A/cm² of the inverted average current density obtained when material for the non-magnetic layer 7 was Cu in the Comparative Example, the inverted average current density JAV could be further reduced when the magnetic layer on the side of the magnetic recording layer 6 in the second magnetization pinned layer 8 had the following composition.

$0 \leq x \leq 1$; $Co_xFe_{1-X}$

As explained above, according to each of the embodiments of the invention, a magneto-resistance effect element and a magnetic memory where a current required for spin injection writing is low can be obtained.

Incidentally, even if a stacking order of the non-magnetic layer and the tunnel barrier layer is inverted, similar advantage can be obtained.

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general inventive concepts as defined by the appended claims and their equivalents.

What is claimed is:

1. A magneto-resistance effect element comprising:
a first magnetization pinned layer whose direction of magnetization is pinned;
a magnetization free layer whose direction of magnetization is variable;
a tunnel barrier layer which is provided between the first magnetization pinned layer and the magnetization free layer;
a second magnetization pinned layer which is provided on the opposite side of the magnetization free layer from the tunnel barrier layer and whose direction of magnetization is pinned to be substantially parallel to the direction of magnetization of the first magnetization pinned layer, and;
a non-magnetic layer which is provided between the magnetization free layer and the second magnetization pinned layer,
a direction of magnetization of the magnetization free layer being made variable when a current is caused to flow between the first magnetization pinned layer and the second magnetization pinned layer, wherein
when the second magnetization pinned layer is made of ferromagnetic material including Co, material for the non-magnetic layer is metal including at least one element selected from the group consisting of Mn, V, and Rh;
when the second magnetization pinned layer is made of ferromagnetic material including Fe, material for the non-magnetic layer is metal including at least one element selected from the group consisting of Ir and Rh; and
when the second magnetization pinned layer is made of ferromagnetic material including Ni, material for the non-magnetic layer is metal including Mn.

2. The magneto-resistance effect element according to claim 1, wherein the magnetization free layer is a layer having at least one ferromagnetic particle isolated by dielectric or insulator, or a layer having a column-shaped structure made of ferromagnetic material surrounded by dielectric or insulator.

3. A magneto-resistance effect element comprising:
a first magnetization pinned layer whose direction of magnetization is pinned;
a magnetization free layer whose direction of magnetization is variable;
a tunnel barrier layer which is provided between the first magnetization pinned layer and the magnetization free layer;
a second magnetization pinned layer which is provided on the opposite side of the magnetization free layer from the tunnel barrier layer and whose direction of magnetization is pinned to be substantially parallel to the direction of magnetization of the first magnetization pinned layer, and;
a non-magnetic layer which is provided between the magnetization free layer and the second magnetization pinned layer,
a direction of magnetization of the magnetization free layer being made variable when a current is caused to flow between the first magnetization pinned layer and the second magnetization pinned layer, wherein
the non-magnetic layer includes Cr; and the second magnetization pinned layer has one of the following compositions
$0.5 \leq x \leq 1$; $Co_xFe_{1-x}$,
$0 \leq y \leq 1$; $Co_yNi_{1-y}$, and
$0 \leq z \leq 0.475$; $Fe_zNi_{1-z}$.

4. The magneto-resistance effect element according to claim 3, wherein the magnetization free layer is a layer having at least one ferromagnetic particle isolated by dielectric or insulator, or a layer having a column-shaped structure made of ferromagnetic material surrounded by dielectric or insulator.

5. A magneto-resistance effect element comprising:
a first magnetization pinned layer whose direction of magnetization is pinned;
a magnetization free layer whose direction of magnetization is variable;
a tunnel barrier layer which is provided between the first magnetization pinned layer and the magnetization free layer;
a second magnetization pinned layer which is provided on the opposite side of the magnetization free layer from the tunnel barrier layer and whose direction of magnetization is pinned to be substantially parallel to the direction of magnetization of the first magnetization pinned layer, and;
a non-magnetic layer which is provided between the magnetization free layer and the second magnetization pinned layer,
a direction of magnetization of the magnetization free layer being made variable when a current is caused to flow between the first magnetization pinned layer and the second magnetization pinned layer, wherein
the non-magnetic layer includes Ir; and the second magnetization pinned layer has one of the following compositions
$0.3 \leq x \leq 1$; $Co_xFe_{1-x}$,
$0 \leq y \leq 1$; $Co_yNi_{1-y}$, and
$0 \leq z \leq 0.7$; $Fe_zNi_{1-z}$.

6. The magneto-resistance effect element according to claim 5, wherein the magnetization free layer is a layer having at least one ferromagnetic particle isolated by dielectric or insulator, or a layer having a column-shaped structure made of ferromagnetic material surrounded by dielectric or insulator.

7. A magneto-resistance effect element comprising:
a first magnetization pinned layer whose direction of magnetization is pinned;
a magnetization free layer whose direction of magnetization is variable;
a tunnel barrier layer which is provided between the first magnetization pinned layer and the magnetization free layer;
a second magnetization pinned layer which is provided on the opposite side of the magnetization free layer from the tunnel barrier layer and whose direction of magnetization is pinned to be substantially parallel to the direction of magnetization of the first magnetization pinned layer, and;
a non-magnetic layer which is provided between the magnetization free layer and the second magnetization pinned layer,
a direction of magnetization of the magnetization free layer being made variable when a current is caused to flow between the first magnetization pinned layer and the second magnetization pinned layer, wherein the non-magnetic layer includes Mn; and the second magnetization pinned layer has one of the following composition $0 \leq x \leq 0.64$; $Co_xFe_{1-x}$, and
$0.4 \leq z \leq 1.0$; $Fe_zNi_{1-z}$.

8. The magneto-resistance effect element according to claim 7, wherein the magnetization free layer is a layer having at least one ferromagnetic particle isolated by dielectric or insulator, or a layer having a column-shaped structure made of ferromagnetic material surrounded by dielectric or insulator.

9. A magneto-resistance effect element comprising:
a first magnetization pinned layer whose direction of magnetization is pinned;
a magnetization free layer whose direction of magnetization is variable;
a tunnel barrier layer which is provided between the first magnetization pinned layer and the magnetization free layer;
a second magnetization pinned layer which is provided on the opposite side of the magnetization free layer from the tunnel barrier layer and whose direction of magnetization is pinned to be substantially parallel to the direction of magnetization of the first magnetization pinned layer, and;
a non-magnetic layer which is provided between the magnetization free layer and the second magnetization pinned layer,
a direction of magnetization of the magnetization free layer being made variable when a current is caused to flow between the first magnetization pinned layer and the second magnetization pinned layer, wherein
the non-magnetic layer includes V; and the second magnetization pinned layer has one of the following compositions $0 \leq x \leq 0.64$; $Co_xFe_{1-x}$, and
$0.375 \leq z \leq 1.0$; $Fe_zNi_{1-z}$.

10. The magneto-resistance effect element according to claim 9, wherein the magnetization free layer is a layer having at least one ferromagnetic particle isolated by dielectric or insulator, or a layer having a column-shaped structure made of ferromagnetic material surrounded by dielectric or insulator.

11. A magneto-resistance effect element comprising:
a first magnetization pinned layer whose direction of magnetization is pinned;
a magnetization free layer whose direction of magnetization is variable;
a tunnel barrier layer which is provided between the first magnetization pinned layer and the magnetization free layer;
a second magnetization pinned layer which is provided on the opposite side of the magnetization free layer from the tunnel barrier layer and whose direction of magnetization is pinned to be substantially parallel to the direction of magnetization of the first magnetization pinned layer, and;
a non-magnetic layer which is provided between the magnetization free layer and the second magnetization pinned layer,
a direction of magnetization of the magnetization free layer being made variable when a current is caused to flow between the first magnetization pinned layer and the second magnetization pinned layer, wherein
the non-magnetic layer includes Rh; and the second magnetization pinned layer has one of the following compositions $0 \leq x \leq 0.62$; $Co_xNi_{1-x}$, and
$0 \leq z \leq 0.63$; $Fe_zNi_{1-z}$.

12. The magneto-resistance effect element according to claim 11, wherein the magnetization free layer is a layer having at least one ferromagnetic particle isolated by dielectric or insulator, or a layer having a column-shaped structure made of ferromagnetic material surrounded by dielectric or insulator.

13. A magneto-resistance effect element comprising:
a first magnetization pinned layer whose direction of magnetization is pinned;
a magnetization free layer whose direction of magnetization is variable;
a tunnel barrier layer which is provided between the first magnetization pinned layer and the magnetization free layer;
a second magnetization pinned layer which is provided on the opposite side of the magnetization free layer from the tunnel barrier layer and whose direction of magnetization is pinned to be substantially parallel to the direction of magnetization of the first magnetization pinned layer, and;
a non-magnetic layer which is provided between the magnetization free layer and the second magnetization pinned layer,
a direction of magnetization of the magnetization free layer being made variable when a current is caused to flow between the first magnetization pinned layer and the second magnetization pinned layer, wherein
the non-magnetic layer includes Ru; and the second magnetization pinned layer has one of the following compositions $0 \leq x < 1.0$; $Co_xNi_{1-x}$, and
$0 \leq z \leq 0.8$; $Fe_zNi_{1-z}$.

14. The magneto-resistance effect element according to claim 13, wherein the magnetization free layer is a layer having at least one ferromagnetic particle isolated by dielectric or insulator, or a layer having a column-shaped structure made of ferromagnetic material surrounded by dielectric or insulator.

15. A magnetic memory comprising:
a memory cell having the magneto-resistance effect element according to claim 1;
a first wiring electrically connected with one end of the magneto-resistance effect element; and
a second wiring electrically connected with the other end of the magneto-resistance effect element.

16. A magnetic memory comprising:
a memory cell having the magneto-resistance effect element according to claim 3;
a first wiring electrically connected with one end of the magneto-resistance effect element; and
a second wiring electrically connected with the other end of the magneto-resistance effect element.

17. A magnetic memory comprising:
a memory cell having the magneto-resistance effect element according to claim 5;
a first wiring electrically connected with one end of the magneto-resistance effect element; and
a second wiring electrically connected with the other end of the magneto-resistance effect element.

18. A magnetic memory comprising:
a memory cell having the magneto-resistance effect element according to claim 7;
a first wiring electrically connected with one end of the magneto-resistance effect element; and a second wiring electrically connected with the other end of the magneto-resistance effect element.

19. A magnetic memory comprising:
a memory cell having the magneto-resistance effect element according to claim 9;
a first wiring electrically connected with one end of the magneto-resistance effect element; and
a second wiring electrically connected with the other end of the magneto-resistance effect element.

20. A magnetic memory comprising:
a memory cell having the magneto-resistance effect element according to claim 11;
a first wiring electrically connected with one end of the magneto-resistance effect element; and
a second wiring electrically connected with the other end of the magneto-resistance effect element.

21. A magnetic memory comprising:
a memory cell having the magneto-resistance effect element according to claim 13;
a first: wiring electrically connected with one end of the magneto-resistance effect element; and
a second wiring electrically connected with the other end of the magneto-resistance effect element.

* * * * *